(12) United States Patent
Fukuda et al.

(10) Patent No.: US 7,642,145 B2
(45) Date of Patent: Jan. 5, 2010

(54) METHOD FOR PRODUCING ELECTRONIC DEVICE

(75) Inventors: Hiroshi Fukuda, Kodaira (JP);
Yoshiyuki Yokoyama, Tonami (JP);
Takashi Hattori, Musashimurayama (JP); Toshio Sakamizu, Tokyo (JP);
Tadashi Arai, Kumagaya (JP); Hiroshi Shiraishi, Hachioji (JP)

(73) Assignee: Hitachi, Ltd., Tokyo (JP)

(*) Notice: Subject to any disclaimer, the term of this patent is extended or adjusted under 35 U.S.C. 154(b) by 866 days.

(21) Appl. No.: 10/523,247

(22) PCT Filed: Jul. 30, 2002

(86) PCT No.: PCT/JP02/07760

§ 371 (c)(1),
(2), (4) Date: Sep. 16, 2005

(87) PCT Pub. No.: WO2004/012012

PCT Pub. Date: Feb. 5, 2004

(65) Prior Publication Data

US 2006/0105273 A1  May 18, 2006

(51) Int. Cl.
*H01L 21/8238* (2006.01)
(52) U.S. Cl. .................. 438/199; 438/48; 438/82; 438/717; 438/725; 438/758; 257/E21.024
(58) Field of Classification Search ............... 438/148; 430/58.3
See application file for complete search history.

(56) References Cited

U.S. PATENT DOCUMENTS 6,197,473 B1 * 3/2001 Kihara et al. ............... 430/192

OTHER PUBLICATIONS

Yukinori Ochiai et al., "High-Resolution, High-Purity Calix[n]arene Electron Beam Resist", Journal of Photopolymer Science and Technology, vol. 13, No. 3, (2000), pp. 413-417.
Tetsuya Tada et al., "Improved Sensitivity of Mulit-Adduct Derivatives of Fullerene", Journal of Photopolymer Science and Technology, vol. 14, No. 4, (2001), pp. 543-546.
Tsuyohiko Fujigaya et al., "A New Photoresist Based on Poly(propyleneimine) Dendrimer", Journal of Photopolymer Science and Technology, vol. 13, No. 2 (2000), pp. 339-344.

* cited by examiner

*Primary Examiner*—N Drew Richards
*Assistant Examiner*—Kyoung Lee
(74) *Attorney, Agent, or Firm*—Stites & Harbison PLLC; Juan Carlos A. Marquez, Esq.

(57) ABSTRACT

There is a problem in that when the demand accuracy with respect to a semiconductor pattern dimension comes close to a resist molecule size with miniaturization, the device performance is deteriorated due to edge roughness of a resist pattern to exert a bad influence on the system performance. The present invention overcomes the problem by the procedure in which super-molecules which are small in dimension as compared with the conventional polymers are used as main components, the reaction number required for the change of molecule solubility is made constant and as large as possible, and an acid generator is made clathrate or combinatory n super molecules to make an acid catalyst concentration large. As a result, it is possible to form a pattern of molecular accuracy with high productivity even with respect to the pattern dimension less than 50 nm, thereby realizing the high performance system.

21 Claims, 10 Drawing Sheets

METHOD FOR PRODUCING ELECTRONIC DEVICE

TECHNICAL FIELD

The present invention relates to a method of manufacturing electronic devices such as semiconductor integrated circuits, and particularly relates to lithography processes for forming the circuit patterns with high accuracy, and a radiosensitive chemical compound used therefor.

BACKGROUND ART

At present, in the semiconductor integrated circuits, miniaturization of circuit pattern feature is progressing, and particularly shortening of a gate length of CMOS transistors and reduction of an interconnect pitch are being accelerated. With this, critical dimension accuracy is required for these circuits. The leading resist material used to form presently latest miniature circuit patterns is the so-called chemically amplified resist. The photo acid generation agents which generate acid by exposure are dispersed into the matrix resins, and solubility of the matrix resins is changed by catalytic reaction of acid generated in the exposure section. For example, in the positive tone resist for KrF excimer laser exposure or electron beam (EB) exposure, a (phenolic) hydroxyl group of aqueous base soluble poly hydroxyl styrene resin (PHS) is replaced with a suitable non-polar protection group broken away from acid-catalyzed reaction to make it alkali non-solubility. In addition, the protection group is subjected to de-protection reaction by acid generated in the exposure section to thereby change polarity of the exposure section to make it soluble in alkali development liquid, thus realizing the positive type. Further, in ArF, for example, cyclic-olefin/acrylate copolymers are made to be matrix resin, its polarity group (soluble) is protected by suitable and non-polarity group in a manner similar to KrF to make it non-soluble, which is subjected to de-protection by an acid catalyst to make to soluble. In the general chemically amplified positive resist on the basis of the de-protection reaction, one high molecule is a copolymer (m+n) of m numbers of protected monomer and n numbers of de-protected monomer. When the protection rate m/(m+n) is to be smaller than a predetermined value by the acid catalyzed reaction, solubility increases rapidly.

On the other hand, as the negative-tone reaction mechanism, a cross linking type and a polarity change type are known. In the cross linking type, a cross linker molecule having a plurality of reaction groups coupled to high molecules constituting a resist matrix (a main element constituting a resist film) by the acid catalyst reaction in addition to the above-described acid generation agent is dispersed into the resist. The high molecules are connected together through the cross linking agent by catalyst reaction of acid generated in the exposure section to increase the molecular weight (further resulting in gel-formation), thus being hard to be soluble into a development liquid. As the polarity change type, a polymer or a molecule including a reaction group which changes from polarity to non-polarity by the acid catalyst reaction is known. As such a reaction as described, a pinacol rearrangement reaction and a lactone formation reaction are used.

Further, a resist, with molecules such as calixarane, fullerene, dendrimer, cyclodextrine or the like other than high polymers, used as matrix, has been also proposed and studied. Furthermore, it has been also proposed that the above materials are used to constitute a chemically amplified resist. The calixarane, fullerene, and dendrimer have been discussed in for example, Journal of Photopolymer Science and Technology, Vol. 13, No. 3 (2000), pp. 413-418, Journal of Photopolymer Science and Technology, Vol. 14, No. 4 (2001) pp. 543-546, and Journal of Photopolymer Science and Technology, Vol. 13, No. 2 (2000) pp. 339-344, respectively.

DISCLOSURE OF THE INVENTION

The above-described chemically amplified resist poses a problem in that edge roughness is present with miniaturization. The edge roughness (or line edge roughness, commonly called LER) is a phenomenon in which edges of resist patterns are locally (normally, within the range of length of line width or so) varied, and the variation is transferred from the resist pattern to the circuit pattern by etching to affect on the performance of the circuit pattern. One example of the line edge roughness is shown in FIG. 11. For example, in the CMOS transistor of the so-called 90 nm art node, LER if the ArF exposure resist applied to gate length 65 nm reaches 6 nm to 10 nm, more than 10% of the gate length, with respect to the gate length 65 nm. In this case, it can be considered that since the gate length varies locally, one MOS transistor is transistors each having a different Lg which are connected in parallel to each other. There occurs a problem in that a surplus leakage current is generated in a portion where Lg is small as shown in FIG. 11 depending on the LER and Vth features. This results in a problem in that the desired transistor performance cannot be obtained, and the higher performance of a semiconductor device is hard to accomplish. Further, in a case of being applied to the interconnect patterns, it is likely that the interconnect width is locally reduced, and the interconnect breakage due to the so-called electro migration (EM) occurs. The line edge roughness is normally qualified by the size of unevenness of an edge position in a direction vertical to the line (for example, $3\sigma$ of distribution of frequency of an edge position) shown downward in FIG. 11.

On the other hand, various resist materials for forming the above-described miniaturized patterns poses a problem in that even where a molecule such as calixarane is used, suppression of high resolution or roughness is hard to coexist with practical sensitivity. For example, in the aforementioned calixarane, the roughness is small but the sensitivity is low because of non-chemically amplified resist. Further, there has been proposed that in the calixarane, a chemically amplified resist is introduced. However, in the cross linking negative resist, suppression of roughness is difficult due to the molecular weight by cross linking and an increase in dispersion thereof as will be mentioned later, whereas in the positive resist having a polarity conversion group introduced therein, control of solubility is difficult due to the mutual action of molecules. Further, in the resist using fullerene, there poses a problem in that low sensitivity and development with organic solvent are necessary. Furthermore, mechanical strength is weak, and patterns are bended due to the surface tension at the time of drying after development and rinsing. Further, there poses a problem in that because the thermal resistance is low, the shape of resist patterns becomes broken due to the heating at the time of base etching, failing to serve as a mask at the time of base etching.

Next, the problem of a method of manufacturing a semiconductor device using a conventional positive resist will be described. In the MOS semiconductor integrated circuit, a pattern for which highest accuracy is required is a gate of the transistor. However, generally, a gate layer is low in pattern density, and therefore when the positive resist which is the main current of the conventional resist is used, it is necessary to direct an energy beam to a major region other than the gate and the interconnect pattern formed from the same layer as the gate. That is, in a case of a large EUV of a light transmission portion in a case of $F_2$ exposure method, and an electron beam transmission portion in a case of EPL, it is necessary to use a large mask of an EUV light reflection portion. However, in the $F_2$ exposure method and EUV exposure method, there is a problem in that when the rate of light transmission portion and reflection portion on the mask is large, the probability of frequency of a mask defect increases to lower the yield. Further, there is a problem in that when the rate of light transmission portion and reflection portion on the mask is large, flare light increases. Further, in EPL using a stencil mask, there is a problem that when the electron beam transmission portion on the mask increases, mechanical strength becomes weak. Further, there is a problem in that when the rate of the electron beam transmission portion is large, a mask transmission current increases so that the desired resolution (or throughput) may not be obtained due to the Coulomb effect. These problems are solved by making a resist to be used a negative type instead of a positive type. To be more specific, the mask to be used is made to be a dark field mask in which the respective patterns of light transmission portion, electron beam transmission portion and EUV light reflection portion are inverted from the case of the positive type. The dark field mask is a mask in which a light transmission portion, an electron beam transmission portion and an EUV light reflection portion which are small in area ratio are present. However, there is a problem in that since the above-described conventional negative type resists are of the cross linking type, the roughness cannot be suppressed sufficiently. There has been assumed that the gate is formed by etching by use of the normal resist as a mask, but in a case of using the so-called damascene gate method, the conventional positive resist may be used.

Further, where a Cu multi-layer interconnect system using a low dielectric constant inter-layer dielectric film is formed using the so-called perforation type dual damascene method, if the conventional positive resist is used when a trench patter is formed after formation of a connection hole, a resolution defect caused by the so-called poisoning occurs. This problem is also solved by using the negative resist, but there is a problem in that the roughness cannot be suppressed sufficiently by the conventional negative resist similar to the above.

Further, according to the studies of the inventors, the roughness has two causes in connection with the principle of the chemically amplified resist. A first cause of the roughness is distribution (localization) of acid generated by exposure. The acid generation agent is dispersed at random into the resist, and a part thereof generates acid by exposure, which is scattered to produce acid catalyst reaction. Accordingly, the space distribution of the acid catalyst reaction reflects the random initial distribution of acid generated, coming into a random state, which is the scattering of the resist pattern edge. A second cause of the roughness is random scattering of solution change caused by acid catalyst reaction in each molecule constituting a resist matrix. The probability of producing the acid catalyst reaction is given continuously as a function of acid concentration. However, the fact that the acid catalyst reaction site for determining solution of individual molecules constituting a matrix produces reaction is completely a probability event. Accordingly, in the transition region of the probability (near the resist pattern edge), even if the acid concentration is the same, molecules are or not are solved. Because of this, the resist pattern edge produces scattering. As described, the line edge roughness is a problem deeply based on the operation principle of the chemically amplified resist.

In summary, to enable use of the dark field mask in patterns of a variety of transfer layers which is high resolution and high sensitivity corresponding to the EPL, EUV exposure systems for processing the gate pattern after the 65-nm node and the interconnect pattern, the resist having both positive and negative type polarities is essential, but it is difficult for the conventional resist to satisfy all these conditions.

It is a first object of the present invention to provide a method of manufacturing a semiconductor device or a semiconductor integrated circuit of high performance and high integration at low cost, using a pattern forming method of high resolution and high sensitivity and which is small in edge roughness.

It is a second object of the present invention to provide a method of processing, with high accuracy, a gate or an interconnect or hole of the semiconductor device or the semiconductor integrated circuit, while suppressing the influence of the mask defect, increase of flare light, deterioration of resolution and the like where the electron beam projection exposure method or the extreme ultraviolet (EUV) projection exposure method.

It is a third object of the present invention to provide a method of manufacturing a semiconductor device in which the thermal and mechanical characteristics of the formed pattern are improved.

The above-describe first object is achieved by the procedure wherein a patterned radiation is applied to thereby acid in a resist (a radiation composition) film, solubility of the resist is changed by reaction with the acid used as a catalyst, and a pattern is formed by development. When a semiconductor device is manufactured, the resist is constituted, as a main component, of molecules (whose average diameter is desired to be 2 nm or less) having a defined molecular weight of 5000 or less including an acid generation group generating an acid catalyst by irradiation of radiation and four or more defined reaction groups generating polarity conversion reaction by the acid catalyst, and is 5% or less of the minimum pattern dimension for transferring an average distance (the inverse number of cubic root of acid concentration) between acid catalyst molecules generated in the exposure section. At this time, preferably, the diffusion length of acid generated is 15% or less of the minimum pattern dimension transferred. Further, it is achieved by making the acid catalyst reaction number required for one molecule to acquire solubility more than 4, or by making an average distance (the inverse number of cubic root of reaction group concentration) between the reaction groups 1% or less of the minimum dimension of the patterns. Furthermore, it is achieved by making the acid generation agent molecules including the acid generation group clathrate to the molecules, or by combining the acid generation group to the molecules.

As the molecules, there can be used super-molecules, for example, cyclodextrine, calixarane, poly-phenol, dendrimer, fullerene, crown ether, androsterone, derivatives of (silicone) Si monomer-oligomer being ballast molecules, those to part of which is introduced a plurality of polarity conversion groups. As the reaction with the acid as a catalyst, there can be used polarity conversion reaction, that is, de-protection reaction of hydroxyl group protected by a suitable protection group utilized in a positive type chemically amplified resist, or lactoned reaction utilized in a negative type chemically amplified resist, carbinol intra molecule dehydration reaction such as pinacol transition, and the like.

The second object is achieved, in the electron beam projection exposure method, or extremely ultra violet projection exposure method, or $F_2$ laser projection exposure method, or ArF excimer laser projection exposure method, by processing a gate layer or an interconnect layer of a CMOS integrated circuit using a negative resist in which a polarity change reaction group such as lactoned, carbinol intra molecular dehydration reaction is introduced into the small nuclear molecule, and a dark field mask. Further, it is achieved by processing an interconnect layer or a hole layer or a gate layer of a CMOS integrated circuit using a positive resist in which a polarity change reaction group such as de-protection reaction is introduced into the small nuclear molecule, and a dark field mask.

The third object is achieved by forming a desired pattern with the resist material, thereafter carrying out DUV curing (or EB curing) which carries out heat treatment while applying DUV light (or electron beam) to the pattern. Alternatively, it is achieved by mixing a thermal cross linker into the resist, and carrying out heat treatment after formation of a pattern to apply thermal cross-linking. Alternatively, it is achieved by projection exposing a desired mask image on the resist material, and thereafter carrying out development using a super critical fluid.

BEST MODE FOR CARRYING OUT THE INVENTION

First, the ground of a means for achieving the above-described first object will be described. As mentioned previously, the main causes of the edge roughness are two: 1) random variation of resolution and non-resolution of molecules in the vicinity of the edge; and 2) presence of acid generated in the resist by exposure. It has been found as the result of analysis made by the inventors that resolution and non-resolution of molecules are suppressed by having only to satisfy at least one out of the following three conditions, and further, preferably, the three conditions are satisfied.

(Condition 1) The number of acid catalyst reactions required for the inversion of solubility is 4 or more per molecule.

(Condition 2) The representative dimension (average diameter) of molecules is at least ½ or less of a pattern dimension to be formed.

(Condition 3) The number of acid catalyst reactions per molecule required for acquiring solubility is constant (scattering is 0).

Generally, in the conventional resist material using a high molecular compound as a base polymer, when the molecular size (molecular weight) of polymer is made small, a polymerization degree reduces to reduce the number of reaction sites per molecule. Accordingly, the above-described (Condition 1) and (Condition 2) are against each other. When the molecular size is large, the roughness occurs due to the shaft effect, whereas when the reaction site number is small (as will be mentioned later), the width of the resolution transition region in the vicinity of the edge is large. Therefore, unevenness of solubility of the individual polymers in the vicinity of the edge increases, and the roughness increases also. The roughness caused by the unevenness of resolution probability of the latter is notable when the reaction number k necessary for solubility change of the individual polymers is 4 or less.

On the other hand, generally, in the synthetic polymer, since the unevenness is present in molecular weight (polymerization degree) and the number of reaction groups per molecule (the protection rate, co-polymerization degree ratio or the like in the case of the positive resist), the unevenness occurs also in the reaction number k necessary for solubility change, and the roughness caused thereby increases. In particular, where the molecular weight is made small in order to suppress the roughness due to the shape effect, the influence of the unevenness of k on the solubility variation increases. For example, mixture of the component of k<4 causes the average roughness to deteriorate.

Figure 7:
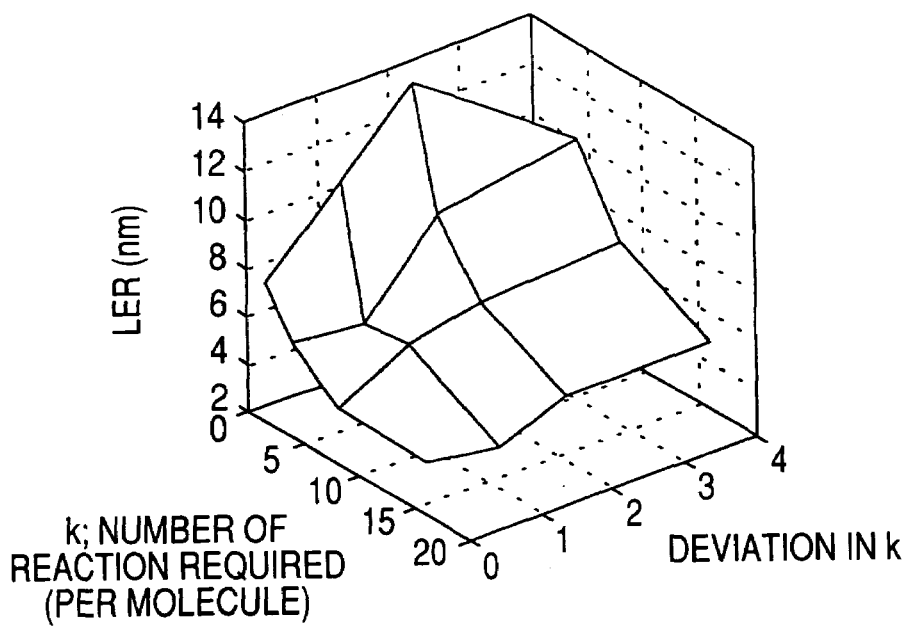
FIG. 7 is a characteristic view showing another example of the analysis result showing the effect of the present invention.

An analysis example of the necessary number of reactions k and unevenness dependence of k are shown in FIG. 7. FIG. 7 shows that k is made to be 4 or more or the unevenness of k is made close to 0, whereby LER is suppressed. The example of FIG. 7 is associated with the extremely limited conditions, but the above-described effect is substantially established with respect to the wider range of conditions.

This problem is solved by using molecules (not polymers) in which a plurality of reaction sites are introduced into the periphery of relatively small nuclear molecules. Molecules are used as the mother nucleus for connecting the reaction sites whereby the reaction site number of molecular size is constant. That is, the unevenness of the molecular weight peculiar to the polymer and the reaction site number are suppressed. In other words, (Condition 1) can be achieved while (Condition 2) and (Condition 3) are satisfied. As such mother nuclear molecules as described, the so-called ultra molecules can be used, for example, such as cyclodextrine, calixarane, dendrimer, poly-phenol, fullerene, crown ether, androsterone derivatives, Si monomer, oligomer, and the like.

Preferably, the reaction group constitutes a chemically amplified resist by the supposition that the solubility of molecule with respect to a development liquid is changed by the acid catalyst reaction. As a reaction group connected to the mother nuclear molecule to control its solubility and a reaction mechanism, there can be utilized de-protection reaction of hydroxyl group protected by a suitable protection group utilized in a positive type chemically amplified resist, or lactoned reaction utilized in a negative type chemically amplified resist, pinacol transition reaction, and the like.

Further, as the number of acid catalyst reactions necessary for one molecule to acquire the solubility is larger, the roughness is more suppressed. To this end, first, the density of reaction site is preferably raised. Some of various mother nuclear molecules and derivatives thereof can be used to make the density of reaction site larger as compared with the conventional polymer. Further, it is probable that in the conventional polymer, polymer chains themselves are entangled to embrace the reaction site therein. Since the reaction site embraced internally is not contributed to the solubility of the molecule, the number of effective reaction sites is not always proportional to the molecular weight. On the other hand, where some of various mother nuclear molecules and derivatives thereof are used, the reaction site is added externally of the mother nuclear molecule and directly contributed to the decision of solubility of the molecule. Because of this, the effective density of reaction site increases. Further, the necessary number of acid catalyst reactions is also achieved by making the concentration of development liquid low in the case of the positive resist, and high in the case of the negative resist.

Next, to suppress an increase of roughness resulting from localization of acid, which is the second main cause of roughness, preferably, the diffusion length of acid is sufficiently longer than the average distance between the closest acid molecules in an exposure portion. However, when the diffusion length of acid is long, sharp distribution of acid concentration produced in the resist film by exposure is faded to thereby lower the effective image contrast and lower the resolution. Further, with this, the roughness caused by random variation of solution and non-solution of the molecule increases on the contrary. To suppress this, preferably, the following conditions are satisfied.

(Condition 4) The diffusion length of acid is 15% or less of the smallest pattern dimension W to be transferred.

(Condition 5) The average distance between the closest acid molecules in the exposure section is 5% or less of the smallest pattern dimension W to be transferred.

Figure 8:
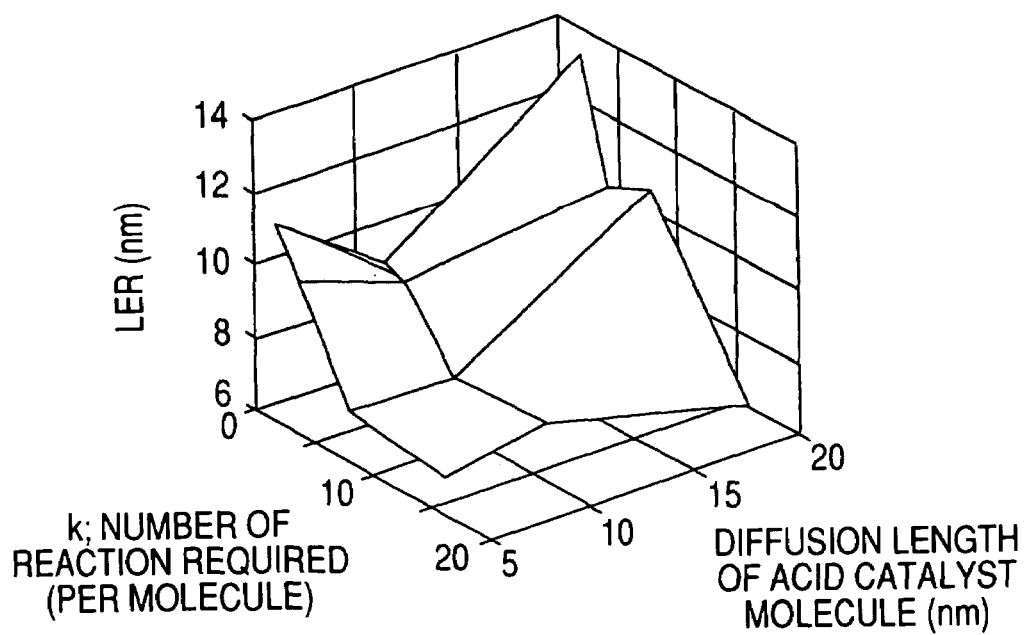
FIG. 8 is a characteristic view showing another example of the analysis result showing the effect of the present invention.
Figure 9:
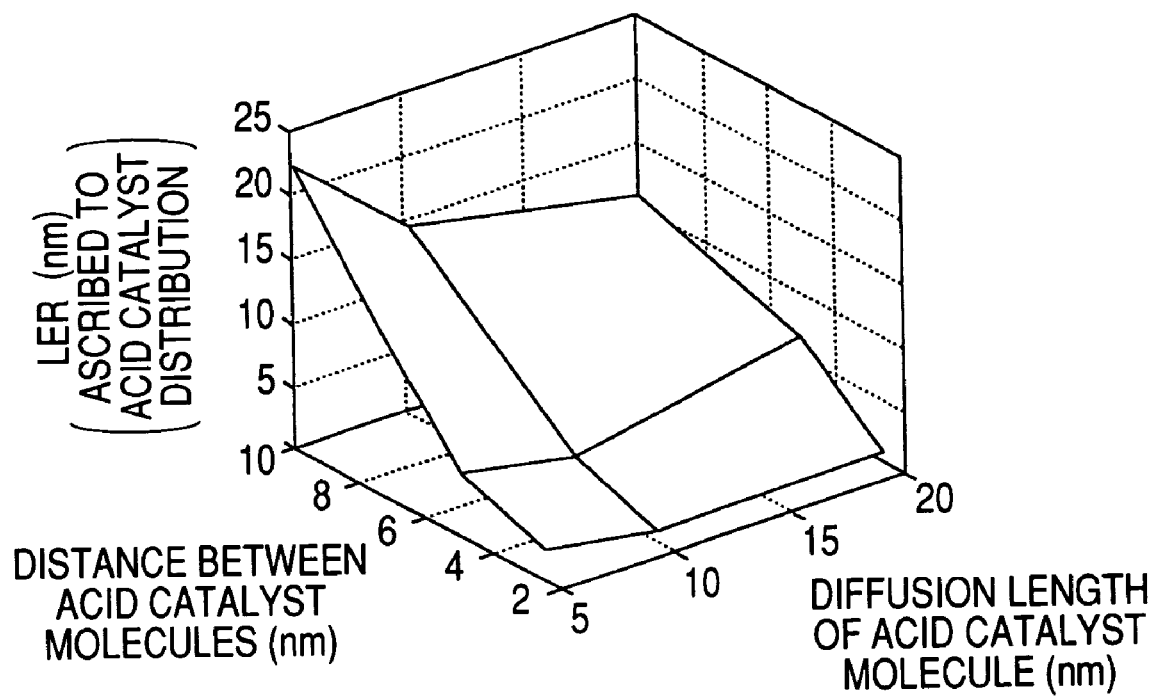
FIG. 9 is a characteristic view showing another example of the analysis result showing the effect of the present invention.
Figure 10:
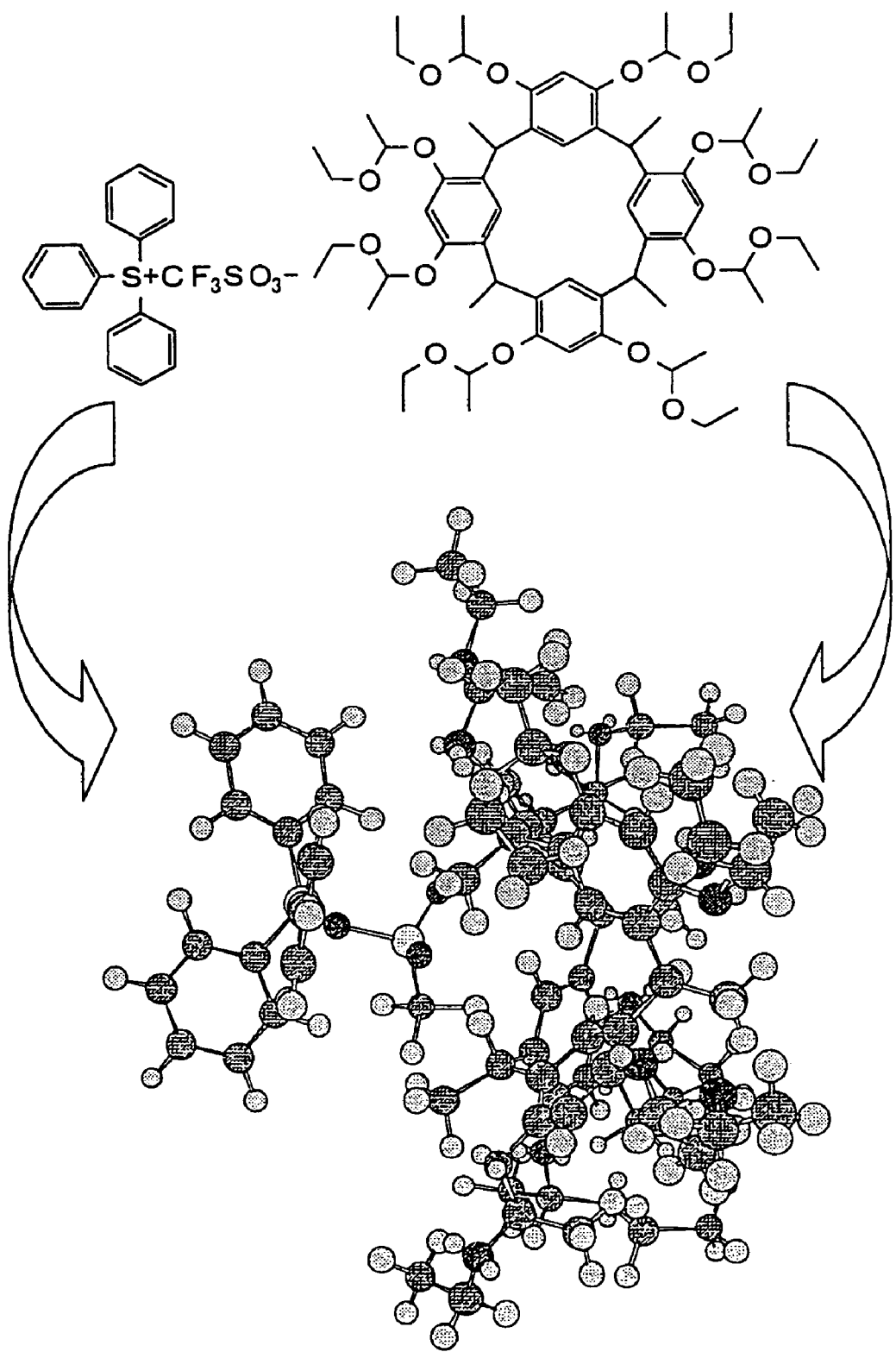
FIG. 10 is a schematic view showing the molecular construction and arrangement of a radio sensitive chemical compound according to one embodiment of the present invention.
Figure 11:
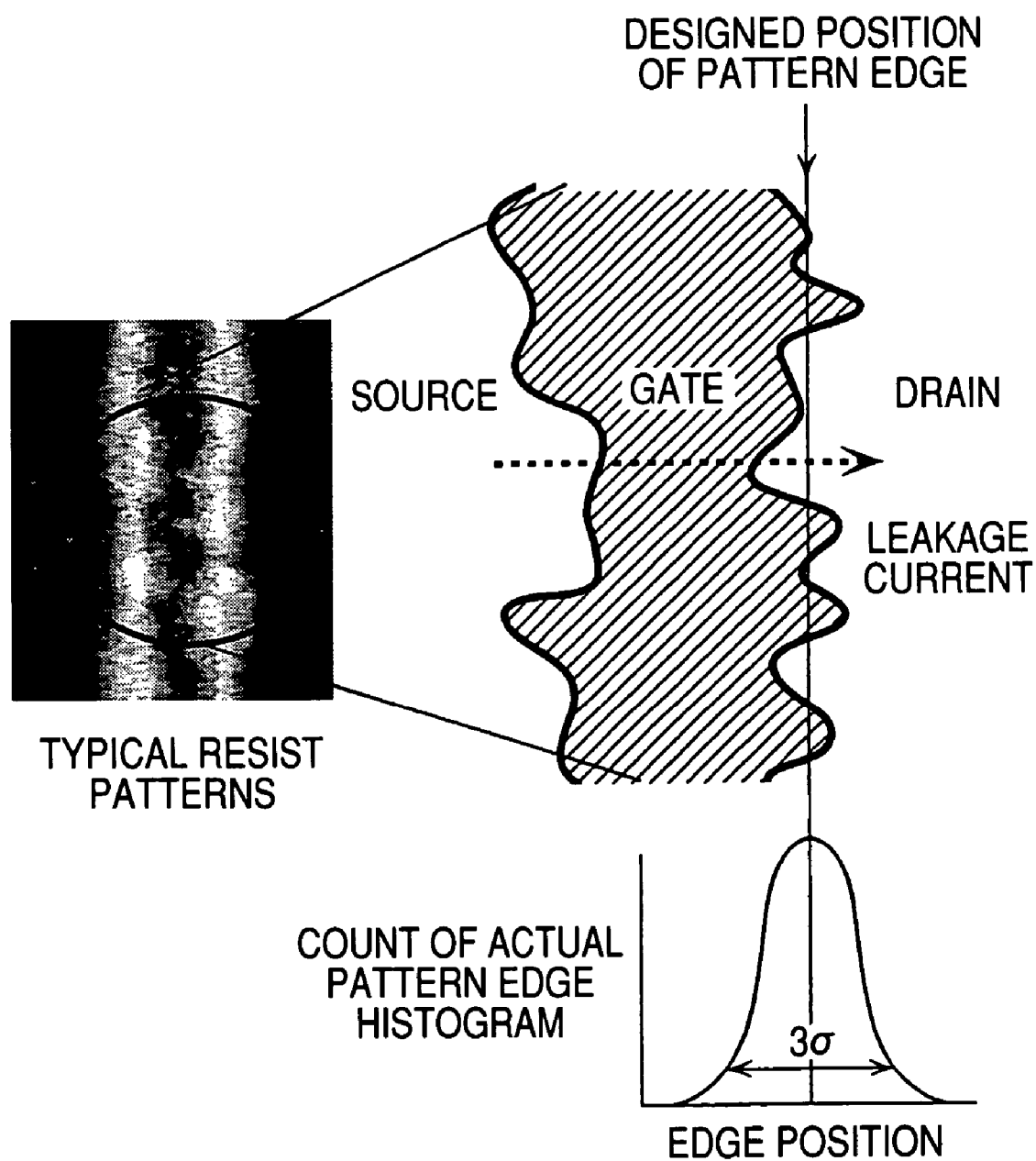
FIG. 11 is a schematic view showing one example of a line edge roughness (LER).

An analysis example of the necessary reaction number of LER and acid diffusion length dependence is shown in FIG. 8. FIG. 8 shows that in addition to that k is made to be 4 or more (desirably, 8 or more), the acid diffusion length is made to be 15% or less of the pattern dimension (since in the analysis example, the pattern dimension is supposed to be 90 nm, less than 15 nm), which suppresses LER. Further, an analysis example of the average distance between the closest acid catalyst molecules of LER and the diffusion length dependence of acid is shown in FIG. 9. It is noted that in FIG. 9, only the component caused by acid distribution of LER is taken into consideration. FIG. 9 shows that the component caused by acid distribution of LER is suppressed by making the distance between acid molecules sufficiently shorter than the acid diffusion length (approximately less than $\frac{1}{3}$). Accordingly, the distance between acid molecules is made to be less than about 5% of the pattern dimension (since in the analysis example, the pattern dimension is supposed to be 90 nm, less than 5 nm), which suppresses LER. The analysis examples of FIGS. 8 and 9 are associated with extremely limited conditions, but the above results are substantially established with respect to the wider range of conditions also.

When the pattern dimension is set to 40 nm (corresponding to the 65 nm technology node), the diffusion length is preferably set to 6 nm or less, as compared with (Condition 4). The suppression of the diffusion length is generally achieved by lowering a temperature of bake after exposure, reducing time, making use of acid (PAG having a relatively large anion portion) of the kind in which the diffusion coefficient is small, and the like.

On the other hand, to satisfy (Condition 5), the concentration of acid need be more than $$1/(0.05^3 \cdot W^3) = 10^4/W^3 \text{ (number/}\mu m^3\text{)}$$

When 25% of PAG in the exposure section generates acid, PAG concentration is four times the above value. The weight ratio (%) of necessary PAG is desirably more than $4 \cdot Mw/(c \cdot 10^{-12} \cdot Na \cdot 0.05^3 \cdot W^3) \times 100(\%) = 2 \cdot 10^{-3}/W^3(\%)$ (supposing that specific gravity c of resist film is 1.1 g/cm$^3$, and molecular weight Mw of PAG is about 400). It is noted that Na is Avogadro's number.

All the conditions for suppressing the acid diffusion length act in the direction of lowering resist sensitivity (the exposure amount necessary for forming patterns increases), but the increase of the acid generator concentration enhances sensitivity on the contrary, and therefore both are offset against each other and sensitivity is held approximately equally.

The PAG concentration has to be raised according to miniaturization, from (Condition 5). However, in the conventional resist, when the PAG concentration is raised, PAG molecules are aggregated, and PAG and polymer result in phase separation. The limit of solid solution degree of PAD concentration is more or less than 10 wt %, posing a problem in that the concentration is difficult to increase while uniformly scattering PAG into the resist film. These circumstances are similar to the case where the super molecule is utilized in the mother nucleus. For this reason, in the present invention, to solve this and achieve the desired acid generator concentration, the acid generator molecules are made clathrate in or combined to molecules to be the mother nucleus of the resist. In the conventional resist (supposing that polymer molecular weight is 20,000, PAG weight ratio is 2-5%, polymer size is 3 to 4 nm, and the average distance between PAGs is 3 nm), the ratio of the polymer molecule number $N_{polymer}$ to the PAG molecular number $N_{pag}$ is about 2:1 to 1:1. Here, where the conventional polymer is replaced with the molecule in which the super molecule is the mother nucleus, the molecular weight becomes smaller by about 1-fraction to single figures than the conventional polymer. Supposing that the PAG weight ratio is held equally, the ratio of the molecular number is about 10:1 to 5:1. Thus, PAG can be combined to or made clathrate in individual super molecules to thereby increase the PAD concentration by about single figures.

Cyclodextrine easily makes clathrate a hydrophobic group such as a phenyl group or the like, which properties have been already utilized industrially widely in food, cosmetics and the like. The same is true for calixarane, dendrimer, and the like. PAG is made to have properties as a guest with respect to a super molecule host whereby PAG can be introduced at the rate of 1:1 ideally into each super molecule. For example, a cation portion of PAG can be made to be a hydrophobic group of the size capable of being made clathrate in cyclodextrine. An acid generation group may be connected to a nuclear molecule without being made clathrate. A method for connecting an acid generation group to a polymer has been reported. Using these well-known methods, it is possible to connect an acid generation group to various super molecules in place of a polymer. Thus, the introducing amount of PAG can be increased considerably.

Further, it has been known that when light is incident on a dendrimer molecule, energy of irradiation light is collected to transmit it to a molecule made clathrate in the center portion. Where PAG has been made clathrate in such a dendrimer molecule as described, acid generation efficiency of PAG can be enhanced. That is, also where a feeble light is incident, light energy collected in the wide range by a dendrimer molecule embracing PAG is concentrated on the PAG portion in the central portion, because of which the acid generation reaction tends to occur. Thus, a resist of extremely high sensitivity can be obtained.

In this case, if a dendrimer molecule is spherical and as large as possible, the sensitivity increasing effect is large.

It is noted that all the five conditions, (Condition 1) to (Condition 5), are desired to be satisfied ideally, but where the roughness can be suppressed to be less than the practically necessary lowest level, some of them may not be satisfied. For example, the clathrate of PAG by a mother nuclear molecule is not always the essential condition of the present invention. Even in a case of not being made clathrate, the practically sufficient acid concentration is obtained, and where other conditions are satisfied, the effect of the present invention can be expected sufficiently.

Next, the ground of a means for achieving the second object will be described hereinafter. A polarity change reaction group such as pinacol transition reaction, lactoned reaction and the like can be introduced into the small mother nuclear molecule to thereby realize a negative resist of small roughness. When the negative resist is used for a gate layer of a CMOS integrated circuit, an area ratio of the gate on which an energy beam need be incident and the interconnect region is relatively small, because of which a mask to be used is the so-called dark field mask. This can solve various problems such as the mask defect in $F_2$ and EUV, influence of flare light, deterioration of mechanical strength of a stencil mask in EPL, deterioration of resolution caused by the Coulomb effect, and the like, as mentioned previously. Where a dark field mask is used, desirably, in the main layer of CMOSLSI are used a negative resist in a gate layer, a positive resist in contact and via layers, and a resist having a positive polarity in an interconnect (damascene trench), in view of the ratio of pattern area. In particular, to apply a dark field mask in the gate layer for which reduction of edge roughness is required, the negative resist is essential. At this time, a polarity change type is preferred as a negative resist rather than a cross-linking type in order to hold the uniformity of the number of reaction sites and the molecular sizes. That is, in a case of the cross-linking type negative resist shown in Japanese Patent Laid-open No. 62-164045, in an exposure section or a partial exposure section in the vicinity of a pattern edge, matrix molecules are progressively connected to one another by the cross-linking reaction (through a cross linker). Since this course is a random probability course, molecules after cross linking produced in the partial exposure portion in the vicinity of the pattern edge have a wide distribution of molecular weight. This makes it difficult to suppress edge roughness. In the present invention, a reaction group which produces de-protection reaction or lactoned reaction, and pinacol transition reaction is given to a small mother nuclear molecule by an acid catalyst, which thereby constitutes a resist of both positive and negative polarities, making it possible to selectively use them according to the applied layers.

Next, a method for solving problems in connection with the process where the above-described materials are used for achieving the third object will be described hereinafter. Where such a relatively small molecule (super molecule) as to satisfy (Condition 2) described above is used as a mother nucleus, mutual action between molecules is so small that high polymer chains are not entangled as in the conventional resist. It is therefore likely to be fragile thermally and mechanically (for example, a glass transition temperature Tg is low). In this case, DUV curing (or FB curing) for carrying out heat treatment while emitting DUV light (or an electron beam) after formation of patterns is carried out to thereby enhance thermal resistance. Further, a thermal cross linker is mixed into a resist in advance and heat treatment is carried out after formation of patterns to thereby produce a thermal cross linking between the super molecules and enhance thermal resistance. Further, there is a problem in that at the time of drying after resist development and rinsing, attraction is produced between resist patterns due to surface tension of rinsing liquid (water) to bend or collapse patterns. It is possible to prevent the bending by using development by a super critical fluid small in surface tension. In the material according to the present invention, the number of hydroxyl groups having super molecules to be a mother nucleus is constant, and therefore complete protection is enabled. In addition, solubility can be provided for non-polarity super critical fluid such as carbon dioxide. The exposure section is shifted to polarity by de-protection, and is not soluble with respect to non-polarity super critical fluid to be negative. Further, in the materials according to the present invention, a predetermined number of reaction groups lactoned by acid catalyst can be given to the mother nuclear molecule. In this case, all the reaction groups are lactoned by a predetermined amount of exposure to make the exposure section non-polarity, thus enabling formation of a positive resist.

Where the positive resist is constituted by completely protected molecules alone, it is sometimes that sufficient solubility is hard to realize even if the exposure is done. In this case, a suitable mixture of a completely protected molecule, and a partly protected or not protected molecule may be used as a resist matrix. Similarly, also in the negative resist, lactoned molecules may be suitably mixed. Thus, resist sensitivity is enhanced.

Prior to describing the embodiments of the present invention, a description will be made of a scaling rule for suppressing the roughness to a level lower than a predetermined target (e.g., 5% of line width) due to miniaturization.

First, to scale and suppress together with miniaturization roughness at a molecular level caused by acid localization in the vicinity of an edge, it is necessary to satisfy the following conditions.

(Scaling rule 1) Where the smallest pattern dimension is miniaturized to 1/k, scaling is carried out corresponding thereto so that acid concentration of a chemically amplified resist is $k^3$ times, and diffusion length is 1/k.

Secondly, it is likely that in the resist edge, a concavo-convex caused by molecular shape occurs. To suppress this, it is preferred that the molecule size be reduced in proportion to miniaturization.

(Scaling rule 2) Where the smallest pattern dimension is miniaturized to 1/k, scaling is carried out corresponding thereto so that the resist molecule size is 1/k (molecular weight is approximately $1/k^3$ times).

Thirdly, attention is paid to the fact that the reaction site number per molecule is also reduced with the reduction of molecule size. When a molecule is simply made small, the photosensitive characteristics (response characteristics of change of solubility to exposure) vary also. To maintain this, it is necessary to satisfy the following condition.

(Scaling rule 3) Where the smallest pattern dimension is miniaturized to 1/k, scaling is carried out corresponding thereto so that the volume density of the reaction site number is $k^3$ times).

The scaling rule 3 will be described somewhat in detail hereinafter. Probability P for each molecule to acquire solubility is provided as a function of the energy beam irradiation amount I. With the change of irradiation amount in a direction vertical to the pattern edge (in x direction), the probability is also changed. In the case of the positive resist, it is probable that in the completely shielded portion, probability for each molecule to acquire solubility is approximately 0, whereas in the complete exposure section, probability for each molecule to acquire solubility is approximately 1. A resist pattern edge after development is created within the transition region where the probability changes from 0 to 1. Within the transition region, the molecule acquires or does not acquire solubility, and therefore a position of edge is unreliable. This causes a roughness. When definition of the width of the transition region is made such that the solubility acquiring probability is in the range between 10 and 90% for convenience, the roughness LER is expressed by $$LER = (0.9-0.1)/|dP/dx|_{edge} = (0.9-0.1)/|dP/d(\log I) \cdot NLS|_{edge}$$

where dP/dx is an inclination in the edge vertical direction of solubility acquiring probability distribution in the edge position, and $NLS_{edge}$ (=d(logI)/dx) is a normalized log-slope in the edge vertical direction of irradiation energy intensity distribution (which is generally used as a resolution performance index of an exposure device). Symbol dP/d(logI) is the amount depending on the material alone, NSL is the amount depending on the optical system alone. The roughness is suppressed by making dP/d(logI) maximum, and NLS of the optical system maximum. The ratio between the dimension and LER is expressed by the following equation, from the above-described equation.

$$LER/W = (0.9-0.1)/[dP/d(logI)_{max} \cdot NSL \cdot W]$$

Where miniaturization is made in proportion to the resolution improvement of exposure equipment, NSL·W is maintained constant. (However, actually, the effective value is reduced by acid diffusion.) Accordingly, to maintain the ratio between the dimension and LER, it is necessary to hold $dP/d(logI)_{max}$ constant. Where the effective value of $NLS_{edge} \cdot W$ is reduced by acid diffusion, it is necessary to make $dP/d(logI)_{max}$ larger. On the other hand, $dP/d(logI)_{max}$ depends on the reaction number $N_{site}$ per molecule necessary for acquiring the molecular resolution. $N_{site}$ depends on the molecule size and the volume density of the reaction site number, $$N_{site} = nsite \cdot d_{molecule}^3$$

Wherein nsite is the reaction site number per unit volume, and $d_{molecule}$ is the representative dimension of molecules. (To dissolve large molecules, many reactions are necessary.) Thus, to hold the ratio between the dimension and LER, it is necessary to hold $nsite \cdot d_{molecule}^3$ constant. When $d_{molecule}$ is $1/k$, it is necessary to make nsite $k^3$ times.

From the foregoing, LER can be miniaturized and subjected to scaling by the third scaling rule.

The factors governing roughness includes three factors: a factor caused by dispersion of acid generation, a factor caused by size of molecules, and a factor caused by the width of a transition region of main reaction probability. These factors need be suppressed in a well balanced manner. When the acid presence probability distribution including diffusion is even, and the dimension of molecules is larger than the transition region width (which is called a digital molecule image condition), a concave-convex of a molecule itself is roughness. For the roughness suppression in this case, the low molecular weight is effective. On the other hand, when the molecule is too small, the number $N_{site}$ of reaction sites for determining solubility of each molecule reduces (dP/d(logI) becomes small), and LER increases. Thus, it is preferable that the optimal molecule size be selected depending on the volume density of the reaction site number. It is preferred that with miniaturization, molecules in which the volume density of the reaction site number is as large as possible and the size is as small as possible be used.

The embodiment of the present invention will be described hereinafter.

Embodiment 1

As another embodiment of the present invention, an example will be described in which t-butoxycarbonylethyl-β-cyclodextrine (1) is synthesized.

Under a nitrogen current, sodium hydrate 1.7 g (0.07 mol) was diffused into tetrahydrofuran 30 ml, and a tetrahydrofuran solution 70 ml of β-cyclodextrine 11.3 g (0.010 mol) was dropped. After dropping, it was stirred at room temperature for about 30 minutes, after which bromoacetic acid t-butyle ester 13.7 g (0.07 mol), and tetra-n-butyl ammonium bromide 1.1 g (3.5 mol) were added at once, and refluxing was carried out for 3 hours. Then, a reaction solution obtained was poured into water 40 ml, extraction was done with ethyl acetate, and an organic layer was washed with water three times. The organic layer was dried with sodium sulfate, after which sodium sulfate is filtered, a solvent was removed under reduced pressure from the filtrate for concentration, precipitated again with n-hexane, and then dried to thereby obtain t-butoxycarbonylethyl-β-cyclodextrine 10.3 g (molecular weight 1932).

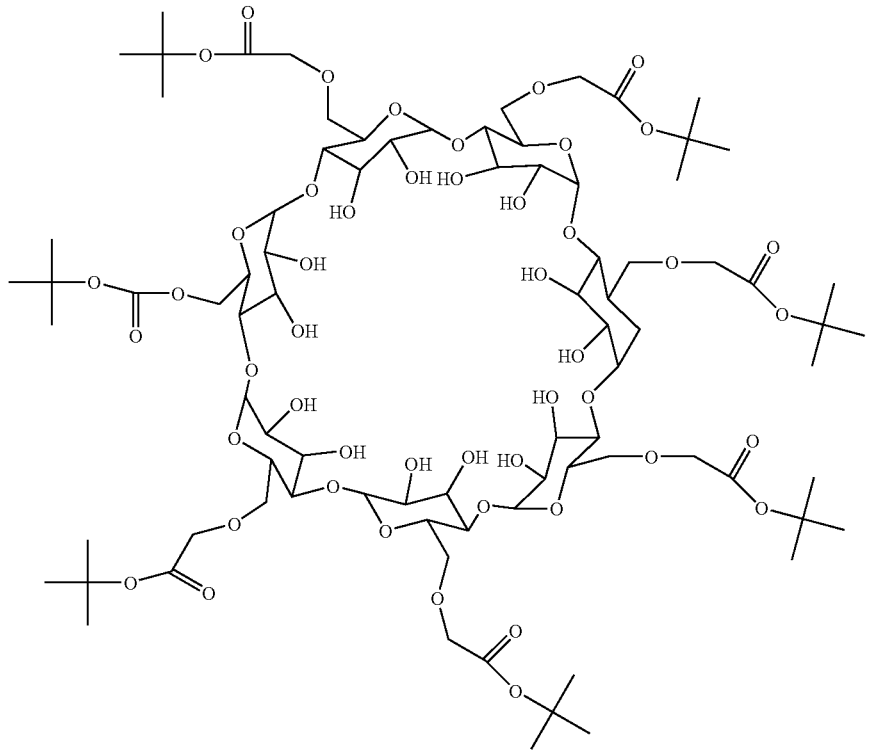

The thus obtained t-butoxycarbonylethyl-β-cyclodextrine (I) 100 parts by weight, acid generator triphenyl sulfonium nonaflate 5 parts by weight, and phenyl pyridine 0.01 parts by weight were dissolved into cyclohexanone 300 parts by weight, and a filtrated resist solution was provided using a Teflon® membrane filter with an aperture diameter of 0.20 µm.

The resist solution was spin-coated on the silicon base processed with hexamethyl disilazane, and after coating it was heated for 2 minutes at 100° C. to form a resist film having a thickness of 150 nm. To the resist film was subjected exposure of line and space pattern using an electron beam writing device of acceleration voltage 50 kV. Thereafter, baking after exposure was carried out for 2 minutes at 120° C., development was carried out for 60 seconds with a tetra methyl ammonium oxide aqueous solution (0.119 wt %) at 23° C., and then, rinsing was done with pure water for 30 seconds. The positive 60-nm line and space pattern was obtained with the exposure amount of 32 µC/cm².

The line edge roughness of the obtained pattern was measured under a scanning electron microscope, and it was about 4 nm. This is a value about one half of the conventional resist with a polymer as a base.

The number of protective groups per molecule of the compound (I) is 7, and its molecular weight is about 1700. The de-protection reaction number per molecule necessary for dissolving increases as the developer concentration becomes a lower level. Here, the developer concentration was set to a concentration such that resolution occurs when about six are de-protected.

The resist was coated on the NaCl plate. Light of a xenon-mercury lamp was emitted to it through an interference filter of 250 nm. At this time, a KrF excimer laser beam was emitted which corresponds, on the sensitivity characteristics curve, to 32 µC/cm² which is the exposure amount used to form patterns with the electron beam writing of the acceleration voltage 50 kV. Measurement was done by an infrared spectrameter before and after the exposure. As a result, it was found that 6 to 7 t-butyl groups out of 7 after baking after exposure were disconnected.

The t-butoxycarbonylethyl-β-cyclodextrine (I) 100 parts by weight, acid generator dimethyl phenyl sulfonium nonafrate 15 parts by weight, and phenyl pyridine 0.05 parts by weight were dissolved into cyclohexanone 500 parts by weight, and a filtrated resist solution was provided using a Teflon® membrane filter with an aperture diameter of 0.20 µm. The resist solution was spin-coated on the silicon base processed with hexa methyl disilazane, and after coating it was heated for 2 minutes at 100(C to form a resist film having a thickness of 150 nm.

In the resist composition, the content of the acid generator is as much as 15 parts by weight, which corresponds to the amount containing about one molecule of the acid generator with respect to one molecule of the t-butoxycarbonylethyl-β-cyclodextrine (I). Here, the acid generator is embraced in an annular portion of cyclodextrine construction, and phase separation is not found, thus enabling to form a uniform coating. In this way, it was possible to contain one acid generator with respect to one cyclodextrine construction on average. Accordingly, a problem could be solved in which it is difficult, while evenly diffusing the acid generator into the resist film, to increase its concentration, which has been difficult in the conventional resist.

The resist solution was spin-coated on the silicon base processed with hexa methyl disilazane, and after coating it was heated for 2 minutes at 100(C to form a resist film having a thickness of 130 nm. To the resist film was subjected exposure of line and space pattern using an electron beam writing device of acceleration voltage 70 kV. Thereafter, baking after exposure was carried out for 2 minutes at 120(C, development was carried out for 60 seconds with a tetra methyl ammonium hydroxide aqueous solution (0.119 wt %) at 23(C, and then, rinsing was done with pure water for 30 seconds. The positive 50-nm line and space pattern was obtained with the exposure amount of 10 µC/cm2. The line edge roughness of the obtained pattern was measured under a scanning electron microscope; it could be further reduced to about 2 nm.

While in the above-described embodiment, dimethyl phenyl sulfonium nonaflate was used as an acid generator, it is noted that as an acid generator having a hydrophobic portion as in a phenyl group capable of being embraced in cyclodextrine, various materials can be utilized in addition to the above acid generator. More specifically, for onium salt, onium salt having a phenyl group on the cation site described above, or onium salt having a phenyl group on the anion site as in triphenylsultonium-p-toluensulfonate is desirable. As those other than onium salt, one that generates viscous acid by irradiation of active radiation will suffice, and for example, sulfonic acid esters, imide sultonate or the like can be used. Examples of imide sulfonate include N-tHdroxynaphthal imide trifluoromethane sulfonate, but imide sulfonate having a phenyl group such as N-Hydroxynaphthalimide toluene sulfonate or N-Hydroxynaphthal imide or campher moiety is desirable because it is easily embraced in the cyclodextrine moiety.

Next, as one embodiment of the present invention, an example in which a negative resist using γ-cyclodextrine as a mother nucleus is synthesized will be described hereinafter.

Under a nitrogen current, sodium hydrate 1.92 g (0.080 mol) was diffused into tetrahydrofuran 30 ml, and a tetrahydrofuran solution 70 ml of γ-cyclodextrin 12,9 g (0.010 mol) was dropped. After dropping, it was stirred at room temperature for about 30 minutes, after which 2-bromo-γ-butyrolactone 14.85 g (0.090 mol), tetra-n-butyl ammonium bromide 1.2 g (3.8 mmol) were added at once, and refluxing was carried out for three hours. Then, a reaction solution obtained was poured into water 400 ml, extraction was done with ethyl acetate, and an organic layer was washed with water three times. The organic layer was dried with sodium sulfate, after which sodium sulfate is filtered, a solvent was removed under reduced pressure and concentrated, precipitated again with n-hexane, and then dried to thereby obtain γ-Butyrolactone-oxy-γ-cyclodextrin (II) 13.5 g (molecular weight 1969).

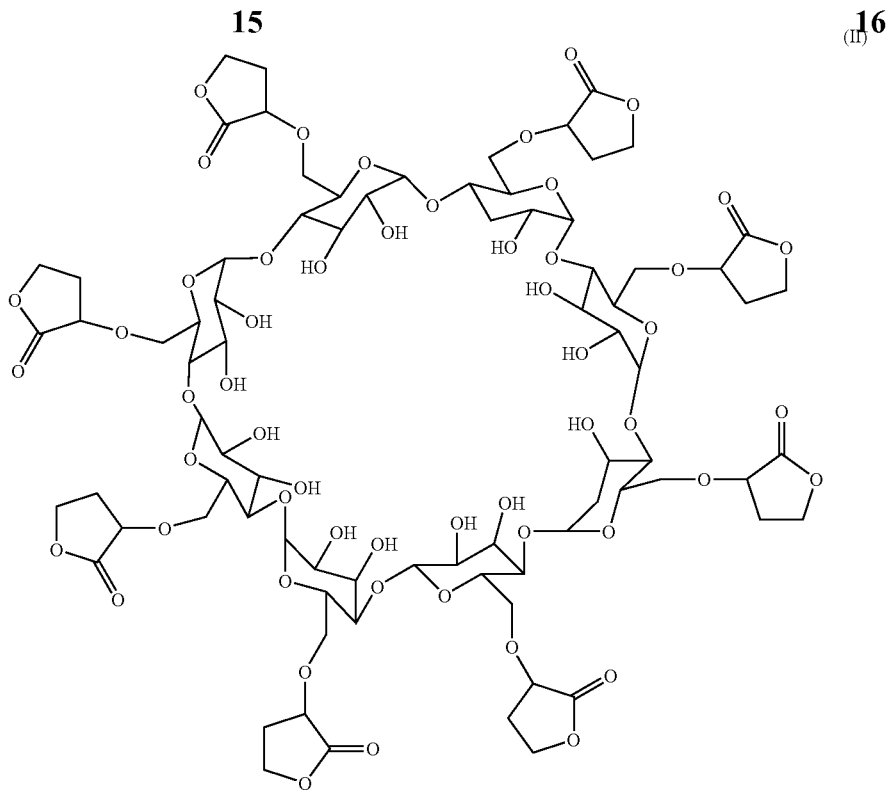

(II)

A compound (II) 6.0 g (3.0 mmol) synthesized as described above was dissolved into tetrahydrofurane 280 ml, a 0.3 N tetramethyl ammonium aqueous solution 185 ml was added and stirred for 6 hours. A hydrochloric acid aqueous solution was gradually added so as to be weak acid. Ethyl acetate about 200 ml was added to the solution, and extraction was done two times, and the obtained organic layer was washed with water two times. After the washing, the organic layer was dried with sodium sulfuric anhydride, after which the solvent was removed under reduced pressure, and the residue was poured into n-hexane 300 ml. Precipitates were filtered and dried to obtain a compound (III) 5.0 g (molecular weight 2113) having 8 γ-calboxylic acid moieties.

(III)

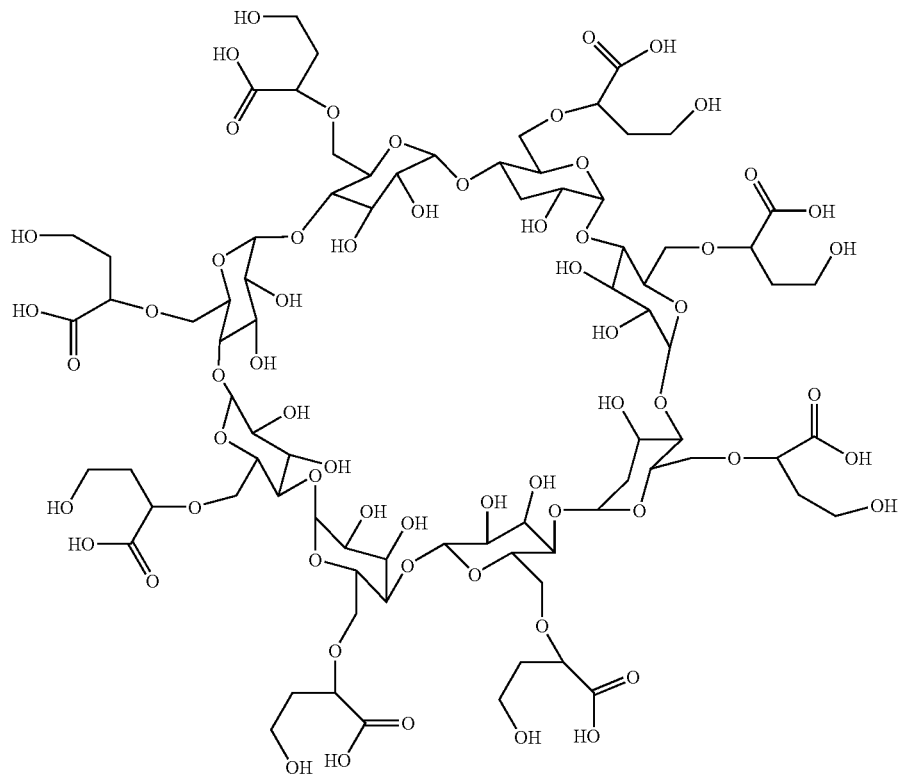

The compound (III) of 100 parts by weight, dimethyl phenyl sulfonium triphlate 14 parts by weight as an acid generator, 2-Benyl pyridine 0.05 parts by weight were dissolved into 1-Methoxy-2-propanol 100 parts by weight. This was filtrated using a Teflon® filter with an aperture diameter of 0.20 μm to provide a resist solution. The resist solution was spin-coated on the silicon base processed with hexsan disilazane, and heated for 90 seconds at 100° C. after the coating, thereby forming a resist film having a thickness of 0.25 μm.

In the resist composition, the content of the acid generator is as much as 14 parts by weight, which corresponds to the amount containing about one molecule of the acid generator with respect to one molecule of the cyclodextrin construction. Here, the acid generator is made clathrate in an annular portion of cyclodextrin construction, and phase separation is not found, thus enabling to form a uniform coating. Thus, it was possible to contain one acid generator with respect to one cyclodextrin construction on average. Accordingly, a problem could be solved in which it is difficult, while evenly diffusing the acid generator into the resist film, to increase its concentration, which has been difficult in the conventional resist.

The exposure of the resist film was carried out using an electron beam projection exposure apparatus. After the exposure, baking after exposure was carried out for 90 seconds at 120° C. Development was carried out for 10 seconds with a tetramethyl ammonium hydroxide aqueous solution (0.048 weight %) at 23° C., and then rinsed with pure water for 15 seconds. As a result, a negative 50-nm line and space pattern was obtained with high sensitivity of exposure amount of 10 μC/cm$^2$. As a result of the measurement, the edge roughness was as small as less than 2 nm.

Further, the exposure of the resist film was carried out through an alternating phase shift mask using an ArF excimer laser stepper (NA=0.75). Thereafter, baking after exposure and development under the process conditions were carried out. As a result, a negative 80-nm line and space pattern of extremely small edge roughness was obtained with the exposure amount of 15 mJ/cm$^2$.

ArF excimer laser of 15 mJ/cm$^2$ was applied to the resist coated on the NaCl plate, and a ultraviolet absorption spectrum after backing before and after exposures was measured by FT-1720X made by Perkin Elmer Ltd. As a result, it was found that a peak of 3300 cm$^{-1}$ caused by carbonic acid and a hydroxyl group has been disappeared after baking after exposure. Further, it was found that a peak of 1705 cm$^{-1}$ of carbonic acid was disappeared and a peak of 1770 cm$^{-1}$ caused by lactone was appeared. Further, it was found that 8 γ-calboxylic acid structures per molecule that were present before exposure form lactone after exposure.

It is noted that as a lactone compound to react with cyclodextrine, 2-bromo-γ-butyrolactone was used, but 2-Bromo-3-dimethyl-γ-butyrolactone, and 2-Bromo-d-valerolactone can be used instead.

Embodiment 2

As another embodiment of the present invention, an example in which 1-ethoxy ethyl calyx [4] resorcinol arene (IV) was synthesized will be described hereinafter. Resorcinol 10.0 g, aceto aldehyde 4.0 g, and distilled water 60 g were stirred, and undiluted sulfuric acid 10 ml was slowly dropped thereon. After dropping, it was refluxed for 4 hours at 70° C., water of 1 l was added after termination of reaction and stirred for about 10 hours. Thereafter, a solid portion was filtered and re-crystallized with ethanol to obtain calix [4] resorcinol arene 11.5 g.

Next, calix [4] resorcinol arene 10.9 g (0.020 mol) is dissolved into tetrahydrofuran 100 ml, into which were put ethyl vinyl ether 13.8 g (0.192 mol) and pyridinum-p-toluene sulfonate 0.90 g and closely plugged, and reacted for 10 hours. After reaction, ethyl acetate 200 ml was added, and washed with 150 ml water three times. Thereafter, it was dried with sodium sulfate, sodium sulfate was filtered, filtrate was condensed, and then re-precipitated with n-hexane, and drying was carried out to obtain 1-ehoxy ethyl calyx [4] resorcinol arene (IV) 7.2 g (molecular weight 1121).

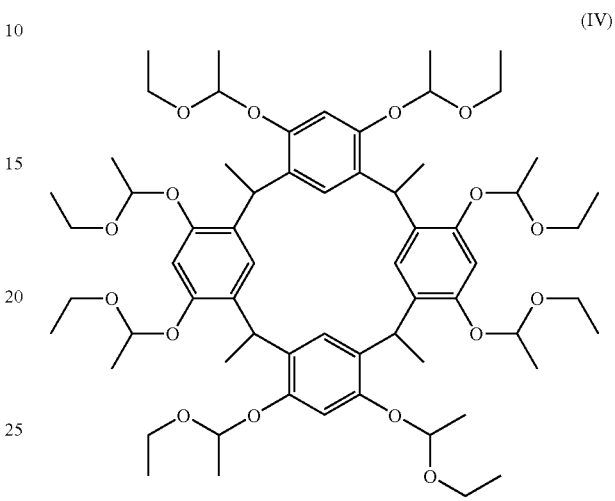

(IV)

The thus obtained 1-ethoxy ethyl calyx [4] resorcinol arene (IV) 100 parts by weight, acid generator triphenyl sulfonium nonafrate 5 parts by weight, and 2-benzylpyrizine 0.01 parts by weight were dissolved into cyclohexanone 300 parts by weight, and filtrated using a Teflon® filer of a diameter 0.20 μm to provide a resist solution.

The resist solution was spin-coated on the silicon base processed with hexa methyl disilazane, and after coating it was heated for 2 minutes at 100° C. to form a resist film having a thickness of 150 nm. To the resist film was subjected exposure of line and space pattern using an electron beam writing device of acceleration voltage 50 kV. Thereafter, baking after exposure was carried out for 2 minutes at 120° C., development was carried out for 60 seconds with a tetra methyl ammonium oxide aqueous solution (0.48 wt %) at 23° C., and then, rinsing was done with pure water for 30 seconds. The positive 50-nm line and space pattern was obtained with the exposure amount of 25 μC/cm$^2$.

The line edge roughness of the obtained pattern was measured with a scanning electron microscope with the result that it was as small as about 3 nm.

The number of protective groups per molecule of the compound (IV) is 8, and the molecular weight thereof is 1120. The de-protection reaction number per molecule necessary for dissolving increases as the developer concentration becomes a lower level. Here, the developer concentration was set to such a level that resolution occurs when about six are de-protected.

Further, with respect to the resist film, etching was carried out by a parallel plate type reactive ion etcher using CHF$_3$ gas. As the conditions, CHF$_3$ flow rate 35 sccm, gas pressure 10 mTorr, and RF bias power 150W were used. As a result, it was found that where commercially available polyhydroxy styrene is 1.0, the etching rate of the resist is 1.25, and dry etching durability is high.

Next, the resist was coated on the NaCl plate. Light of a xenon-mercury lamp was emitted thereto through an interference filter of 250 nm. At this time, a KrF excimer laser beam was emitted which corresponds, on the sensitivity characteristics curve, to 25 μC/cm² which is the exposure amount used to form patterns with the electron beam writing of the acceleration voltage 50 kV.

Measurement was done by an infrared spectra-meter before and after exposure. As a result, it was found that about 7 ethoxy ether groups out of 8 after baking after exposure were disconnected.

The thus obtained 1-ethoxy ethyl calyx [4] resorcinol arene (IV) 100 parts by weight, acid generator triphenyl sulfonium nonafrate 25 parts by weight, and 2-benzylpyrizine 0.05 parts by weight were dissolved into cyclohexanone 500 parts by weight, and filtrated using a Teflon filer having an aperture diameter of 0.20 μm to provide a resist solution.

In the resist composition, the content of the acid generator is as much as 25 parts by weight, which corresponds to the amount containing about one molecule of the acid generator with respect to one molecule of 1-ethoxy ethyl calyx [4] resorcinol arene (IV). Here, the acid generator is made clathrate in an annular portion of calix [4] calyx [4] resorcinol arene construction, and phase separation is not found, thus enabling to form a uniform coating. Thus, it was possible to contain one acid generator with respect to one cyclodextrin construction on average. Accordingly, a problem could be solved in which it is difficult, while evenly diffusing the acid generator into the resist film, to increase its concentration, which has been difficult in the conventional resist.

The resist solution was spin-coated on the silicon base processed with hexa methyl disilazane, and after coating it was heated for 2 minutes at 100° C. to form a resist film having a thickness of 120 nm. To the resist film was subjected exposure of line and space pattern using an electron beam writing device of acceleration voltage 70 kV. Thereafter, baking after exposure was carried out for 2 minutes at 120° C., development was carried out for 60 seconds with a tetra methyl ammonium hydroxide aqueous solution (0.48 wt %) at 23° C., and then, rinsing was done with pure water for 30 seconds. The positive 50-nm line and space pattern was obtained with the exposure amount 8 μC/cm². The line edge roughness of the obtained pattern was measured with a scanning electron microscope with the result that it could be further reduced to about 2 nm.

While in the above-described embodiment, dimethyl phenyl sulfonium nonaflate was used as an acid generator, it is noted that as an acid generator capable being clathrate in calyx [4] resorcinol arene construction, various materials can be utilized.

Next, as another embodiment of the present invention, an example in which a negative resist using calyx [4] resorcinol arene as a mother nucleus is synthesized will be described hereinafter. Under a nitrogen current, sodium hydrate 3.84 g (0.160 mol) was diffused into tetrahydrofuran 40 ml, and a tetrafuran solution 80 ml of calyx [4] resorcinol arene 10.8 g (0.020 mol) was dropped. After dropping, it was stirred at room temperature for about 30 minutes, after which 2-bromo-γ-butyrolactone 29.7 g (0.160 mol), and tetra-n-butyl ammonium bromide 2.4 g (7.6 mol) were added at once, and refluxing was carried out for three hours. Then, a reaction solution obtained was poured into water 400 ml, extraction was done with ethyl acetate, and an organic phase was washed with water three times. The organic layer was dried with sodium sulfate, after which sodium sulfate is filtered, a solvent was removed under reduced pressure and concentrated, precipitated again with n-hexane, and then dried to thereby obtain γ-Butyrolactoned calix [4] resorcinol arene (V) 14.6 g (molecular weight 1217).

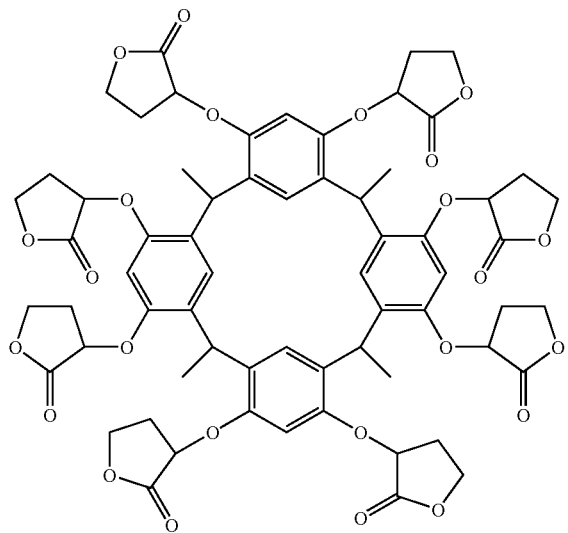

(V)

A compound (V) 7.3 g (6.0 mol) synthesized as described above was dissolved into tetrahydrofurane 400 ml, a 0.13 N tetramethyl ammonium aqueous solution 370 ml was added and stirred for 6 hours. A hydrochloric acid aqueous solution was gradually added so as to be weak acid. Ethyl acetate about 200 ml was added to the solution, and extraction was done two times, and the obtained organic layer was washed with water of 200 ml two times. After washing, the organic layer was dried with anhydrous sodium sulfate, after which the solvent was removed under reduced pressure, and the residue was poured into n-hexane 300 ml. Precipitates were filtered and dried to obtain a compound (VI) 5.3 g (molecular weight 1361) having 8 γ-hydrocalboxylic acid constructions.

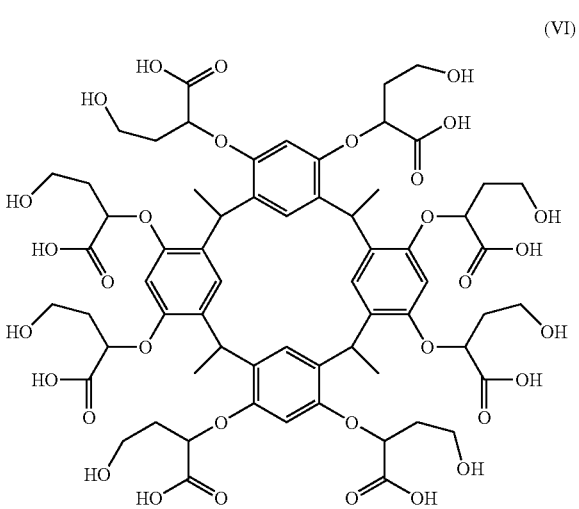

(VI)

The compound of 100 parts by weight (VI), dimethyl phenyl sulfonium triphlate 21 parts by weight as an acid generator, and 2-Benyl pyridine 0.05 parts by weight were dissolved into 1-Methoxy-2-propanol 300 parts by weight. This was filtered using a Teflon® filter of an aperture diameter of 0.20 µm to provide a resist solution. The resist solution was spin-coated on the silicon base processed with hexsan disilazane, and heated for 90 seconds at 100° C. after coating to form a resist film having a thickness of 0.20 µm.

In the resist composition, the content of the acid generator is as much as 21 parts by weight, which corresponds to the amount containing one molecule of the acid generator with respect to one molecule of the calix [4] resorcinol arene construction. Here, the acid generator is made clathrate in an annular portion of the calix [4] resorcinol arene construction, and phase separation is not found, thus enabling to form a uniform coating. Thus, it was possible to contain one acid generator with respect to one cyclodextrin construction on average. Accordingly, a problem could be solved in which it is difficult, while evenly diffusing the acid generator into the resist film, to increase its concentration, which has been difficult in the conventional resist.

The exposure of the resist film was carried out using an electron beam projection exposure apparatus. After exposure, baking after exposure was carried out for 90 seconds at 120° C. Development was carried out for 10 seconds with a tetramethyl ammonium hydroxide aqueous solution (0.048 weight %) at 23° C., and then rinsed with pure water for 15 seconds. As a result, a negative 50-nm line and space pattern was obtained with high sensitivity of exposure amount 7 µC/cm². The edge roughness was measured with the result that it was as extremely small as 2 nm.

Further, the exposure of the resist film was carried out through an alternating phase shift mask using an ArF excimer laser stepper (NA=0.75). Thereafter, baking after exposure and development under the process conditions were carried out. As a result, a negative 80-nm line and space pattern of extremely small edge roughness was obtained.

Embodiment 3

As another embodiment of the present invention, an example will be described in which t-Butoxy carbonyl methyl fullerene is synthesized.

Under a nitrogen current, sodium hydrate 0.17 g (7.0 mol) was diffused into tetrahydrofuran 10 ml, and commercially available aqueous fullerene C60(OH)$_n$(n=22-26) 1.13 g (1.0 mmol) was additionally diffused to a tetrahydrofuran solution 10 ml. It was stirred at room temperature for about one hour, after which bromoacetic acid t-butyle ester 0.14 g (7.0 mmol), and tetra-n-butyl ammonium bromide 0.011 g (0.035 mmol) were added at once, and heating was carried out for one hour at 60° C. Then, the reaction solution obtained was poured into water 40 ml, and the separation was filtered and washed with water to obtain t-Butoxy carbonyl methyl fullerene 1.05 g (molecular weight 1933).

The thus obtained t-Butoxy carbonyl methyl fullerene 100 parts by weight, acid generator triphenyl sulfonium nonafrate 5 parts by weight, and phenyl pyrizine 0.01 parts by weight were dissolved into propylene glycol mono metyle ether 300 parts by weight, and filtrated using a Teflon filer with an aperture diameter of 0.20 µm to provide a filtrated resist solution.

The resist solution was spin-coated on the silicon base processed with hexa methyl disilazane, and after coating it was heated for 2 minutes at 100° C. to form a resist film having a thickness of 100 nm. To the resist film was subjected exposure of line and space pattern using an electron beam writing device of acceleration voltage 50 kV. Thereafter, baking after exposure was carried out for 2 minutes at 120° C., development was carried out for 30 seconds with a tetra methyl ammonium oxide aqueous solution (0.48 wt %) at 23° C., and then, rinsing was done with pure water for 10 seconds. The positive 50-nm line and space pattern was obtained with the exposure amount 22.5 µC/cm². The line edge roughness of the obtained pattern was measured with a scanning electron microscope with the result that it was as small as 2.5 nm.

Embodiment 4

As another embodiment of the present invention, an example in which 1-Ethoxy ethyl octakis (4-hydroxyphenyl) ethyl dimethylsiloxy)silsesquioxane (VII) was synthesized will be described hereinafter.

4-hydroxystylene 9.4 g, and okitakis (dimethyl siloxy)silsesquioxane 10.0 g were dissolved into isopropanol 100 ml, an isopropanol solution 5 ml of hydrogen hexachloroplatinate hydrate 0.05 g was added thereto, and reacted for 6 hours at room temperature. After reaction, a reaction liquid is put into water 200 ml, ethyl acetate 200 ml was added, extraction of the produced octakis (4-hydroxy phenyl) ethyl dimethyloxy) silsesquioxane was carried out. After extraction, washing with water was carried out two times, an organic layer was dried with sodium sulfate, after which a solvent was removed under reduced pressure and condensed, precipitated again with n-hexane and dried to obtain octakis (4-hydroxyphenyl) ethyl dimethylsiloxy)silsesquioxane 16.2 g (molecular weight 1978).

Octakis (4-hydroxyphenyl) ethyl dimethylsiloxy)silsesquioxane 15.8 g (8.0 mmol) was dissolved into tetrahydrofurane, into which ethyl vinyl ether 4.6 g (0.064 mol), and pyridium-p-toluene sulfonate 0.30 g are put and closely plugged, and reacted for 10 hours. After reaction, methyl acetate 200 ml was added, and washing with 150 ml water was carried out three times. Thereafter, it was dried with sodium sulfate, sodium sulfate is filtrated, and a filtrate was condensed, after which re-precipitation with n-hexane and then drying were carried out to obtain 1-Ethoxy ethyl octakis (4-hydroxyphenyl) ethyl dimethylsiloxy)silsesquioxane (VII) 16.8 (molecular weigh 2411).

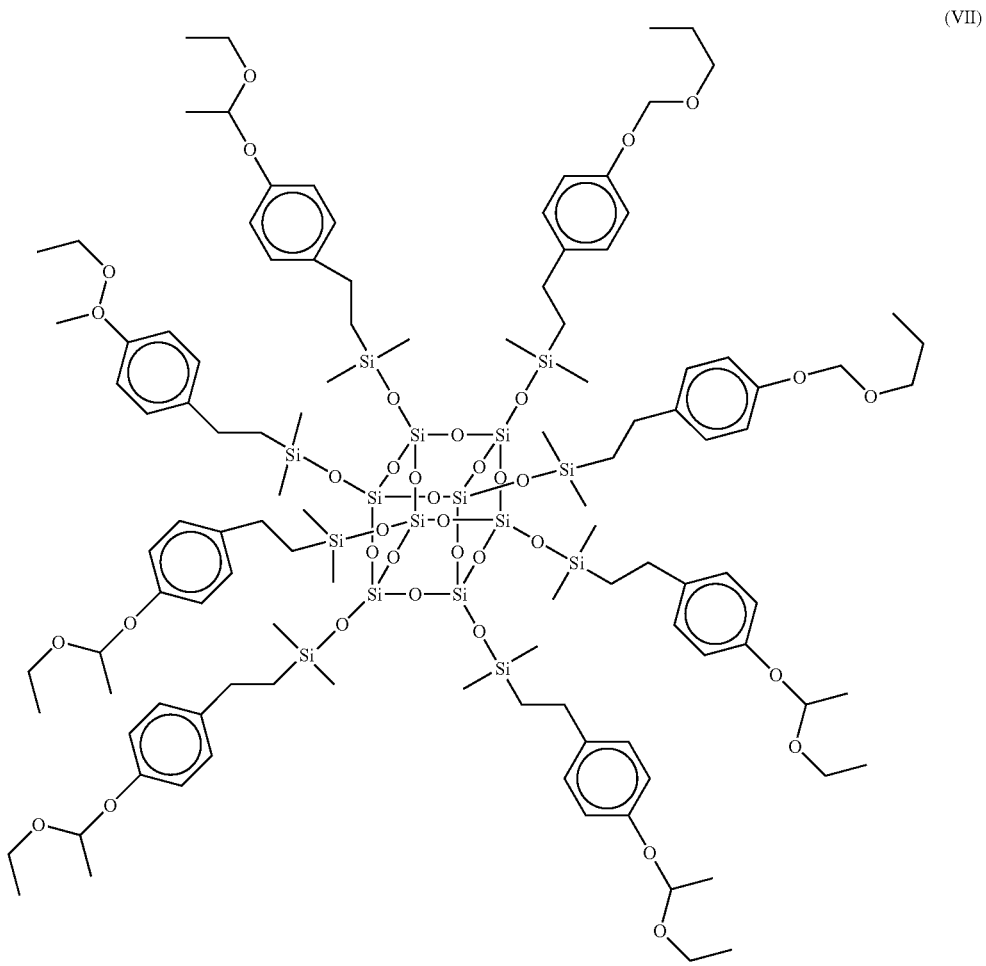

(VII)

The thus obtained 1-Ethoxy ethyl octakis (4-hydroxyphenyl) ethyl dimethylsiloxy)silsesquioxane (VII) 100 parts by weight, acid generator triphenyl sulfonium nonaflate 5 parts by weight, and 2-bendyl pyridine 0.01 parts by weight were dissolved into cyclohexanone 300 parts by weight, and filtrated using a Teflon membrane filter with an aperture diameter of 0.20 μm to provide a first resist solution.

Next, an example will be described hereinafter in which the above-described resist is applied as an imaging layer to the so-called 2-phase resist method. A second resist solution having a normal Novolak resin as a main component was spin-coated on the silicon base process with hexamethyl disirazane, and heated for 15 minute at 200° C. after coating to form a hard-baked organic layer having a thickness of 500 nm. Thereafter, the first resist solution was spin-coated, and heated for two minutes at 100° C. after coating to form a resist layer with a thickness of 100 nm. This resist layer was subjected to exposure of line and space pattern using an electron beam writing device of acceleration voltage 50 kV. Thereafter, baking after exposure was carried out for two minutes at 120° C., development was carried out for 60 seconds with tetramethyl ammonium hydroxide aqueous solution (2.38 weight %) at 23° C., and rinsed with pure water for 30 seconds. A positive 50-nm line and space pattern was obtained with the exposure amount 10 μC/cm². The line edge roughness of the obtained pattern was measured by a scanning electronic microscope with the result that it was as small as 2 nm.

The number of protection groups per molecule of the compound (VII) is 8, and the molecular weight thereof is about 2400. The number of de-protection reactions per molecule necessary for being dissolved increases as a development concentration becomes a lower level. Here, the development concentration was set to a concentration such that resolution occurs when 6 of them are de-protected.

Next, the above-described resist was coated on the NaCl plate. Light of a xenon mercury lamp was emitted thereon through an interference filter of 250 nm. At this time, a KrF excimer laser beam corresponding, on the sensitivity characteristics curve, to 10 μC/cm² which is the exposure amount used to form a pattern by an electron beam writing of acceleration voltage 50 kV described above. Measurement was done by ultraviolet absorption spectrum before and after exposures. As a result, it was found that 6 ethoxy ethyl groups out of 8 were disconnected after baking after exposure.

Further, using the pattern formed on the first resist layer as a mask, etching of the hard baked organic layer was carried out by an O$_2$-RIE etcher. The resist contains a silicon atom of 18 wt %. The etching rate of the resist is 1/22 where the hard baked novolak resin is 1, and the pattern could be transferred to the novolak resin with a high selection ratio. That is, the 2-phase resist process with high accuracy was enabled by the materials of the present embodiment.

Further, in the first resist according to the present embodiment, absorption with 157 nm which is the exposure wavelength of the F$_2$ excimer laser was relatively small, and the absorbance with a thickness of 1 μm was 1.9. The present resist was evaluated using a F$_2$ excimer laser stepper (NA0.80) with a thickness of 100 nm under the conditions similar to those mentioned above, and a positive 60-nm line and space pattern which is extremely small in edge roughness with the exposure amount 17 mJ/cm$^2$.

While in the above-described embodiment, the positive resist has been described, it is to be noted that similarly to Embodiment 2, octakis (4-hydroxyphenyl) ethyl dimethylsiloxy)silsesquioxane is used as a mother nuclear molecule, a reaction group for converting polarity to non-polarity by the acid catalyst reaction may be introduced to the circumference thereof to constitute a negative resist. As such a reaction group as mentioned, for example, γ-hydroxy carbonic acid construction can be used.

From the foregoing, according to the present invention, it is possible to use a 2-layer resist process with high accuracy which is extremely small in edge roughness.

Embodiment 5

As still another embodiment of the present invention, an example will be described in which a positive resist using multi-nuclear phenol as nuclear is synthesized.

TPPA-1000P (made by Honsyu Chemical Industry Ltd.) 5 g was dissolved into ethyl acetate 100 ml, and 3,4-dihydro-2H-pyran 5.0 g and hydrochloric acid 0.02 g were added and stirred for 20 hours at room temperature. A 2% potassium hydroxide aqueous solution 100 ml was added and separated to the solution, an organic phase was washed with water of 100 ml three times, and a solvent was reduced in pressure and dried to obtain TPPA-1000P of 5.5 g (white solid) having phenol hydroxyl group protected by THP (tetrahydropyranyl group). At this time, the protection rate was 80.0%.

TPPA-1000P: 100 parts by weight having a phenol hydroxyl group protected by the THP and triphenylsulfonium nonaflate perfluorobuthane sulfonate 5 parts by weight as an acid generator were dissolved into 2-hepthane, which was filtered by a Teflon membrane filter of diameter 0.2 μm to prepare a solution of a positive photosensitive resin composition according to the present invention.

For the purpose of comparison, Novolak resin: 100 parts by weight, TPPA-1000P: 20 parts by weight having a phenol hydroxyl group protected by the THP shown in the synthesis example as a dissolution inhibitor, and triphenylsulfonium nonaflate perfluorobuthane sulfonate 5 parts by weight as an acid generator were dissolved into 2-hepthanon, which was filtrated by a Teflon membrane filter of diameter 0.2 μm to prepare a solution of a positive photosensitive resin composition for comparison purpose. An example in which PPA-1000P having a phenol hydroxyl group protected by the THP is mixed as a dissolution inhibitor into a chemically amplified resist as described above has already been known.

The above-described two kinds of photosensitive resin composition solutions were dropped on the silicon wafer, and heated for 2 minutes at 120° C. after spin-coating to obtain 0.4 μm-thick coated layers, respectively. After a test pattern was subjected to drawing by an electron beam drawing device (acceleration voltage of an electron beam is 50 kV), heat treatment was carried out for two minutes at 100° C., after which development was carried out for 60 seconds using a tetramethylammonium aqueous solution hydroxide to thereby obtain a good positive pattern of 0.1 μm with suitable electronic beam irradiation amount (about 10 μC/cm$^2$). The line edge roughness of patterns was measured; it was 8 nm in the resist for comparison, and it was reduced to about 3 nm in the resist of the present invention. In the comparative example, since the main component of matrix to constitute a resist is a conventional polymer, the edge roughness is similar to the conventional resist, whereas in the present embodiment, the roughness was reduced.

The number of protection groups per molecule of the TPPA-1000P having a phenol hydroxyl group protected by the THP is 6, and the molecular weight is about 1500. The number of de-protection reaction per molecule necessary for dissolution increases as the developer concentration becomes lean. Here, the developer concentration was set to a concentration such that dissolution occurs when four protection groups are de-protected.

Embodiment 6

As another embodiment of the present invention, an example will be described in which a negative resist using multi-nuclear phenol as nuclear is synthesized.

As the multi-nuclear phenol compound, TPPA-1000P (made by Honsyu Chemical Industry Ltd.) 10.0 g (9.42 mmol) and 2-bromo-γ-butyrolactone 9.33 g (56.5 mmol) were dissolved into tetrahydrofurane 500 ml, and sodium hydroxide 2.71 g (113 mmol) was gradually added. It was stirred for 12 hours at room temperature, after which sodium bromide being precipitated was filtered. Ethyl acetate 500 ml was added to the filtrate, and washed with dilute hydrochloric acid 500 ml and then water of 500 ml. After washing, an organic phase was dried with anhydrous sodium sulfate, after which the solvent was reduced in pressure and removed, and the residue was poured into an n-hexan/tetrahydrofurane mixing solution 300 ml. The precipitated material was filtered to obtain a compound (VIII).

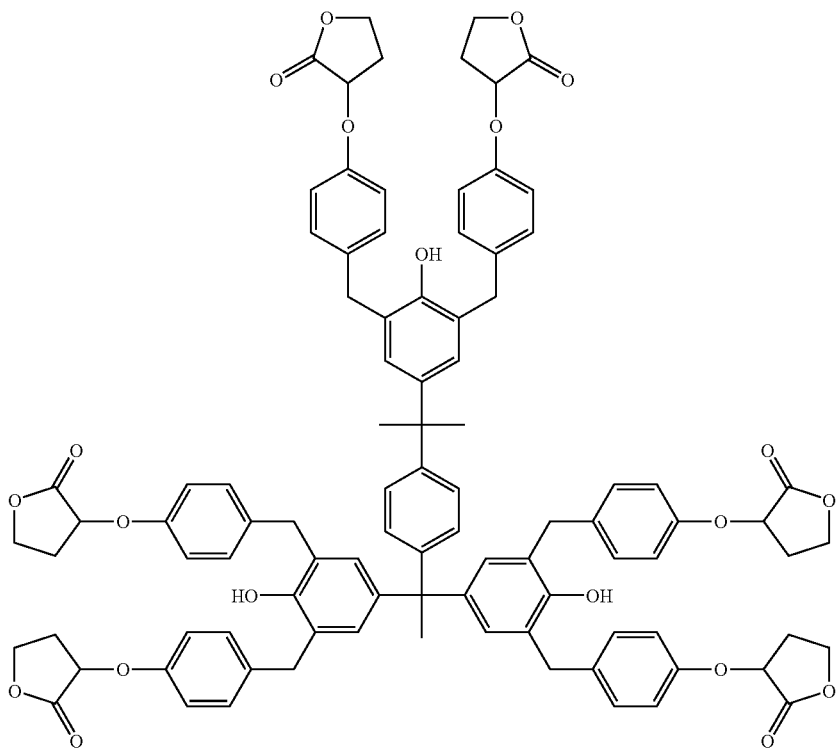

(VIII)

The compound (VIII) 5.0 g (3.19 mmol) synthesized as described above was dissolved into tetrahydrofurane 330 ml, 0.13 N tetramethyl ammonium aqueous solution 221 ml were added, and stirred for 6 hours. A hydrochloric acid solution was gradually added to be weakly acidic. About 330 ml of ethyl acetate was added to the solution, and extraction was done two times, and the obtained organic phase was washed two times with water of 200 ml. After washing, the organic phase was dried with anhydrous sodium sulfate, after which the solvent was reduced in pressure and removed, and the residue was poured into n-hexane 300 ml. The precipitated material was filtrated and dried to obtain a compound (IX) having 6 γ-hydroxy carbonic acid structures.

(IX)

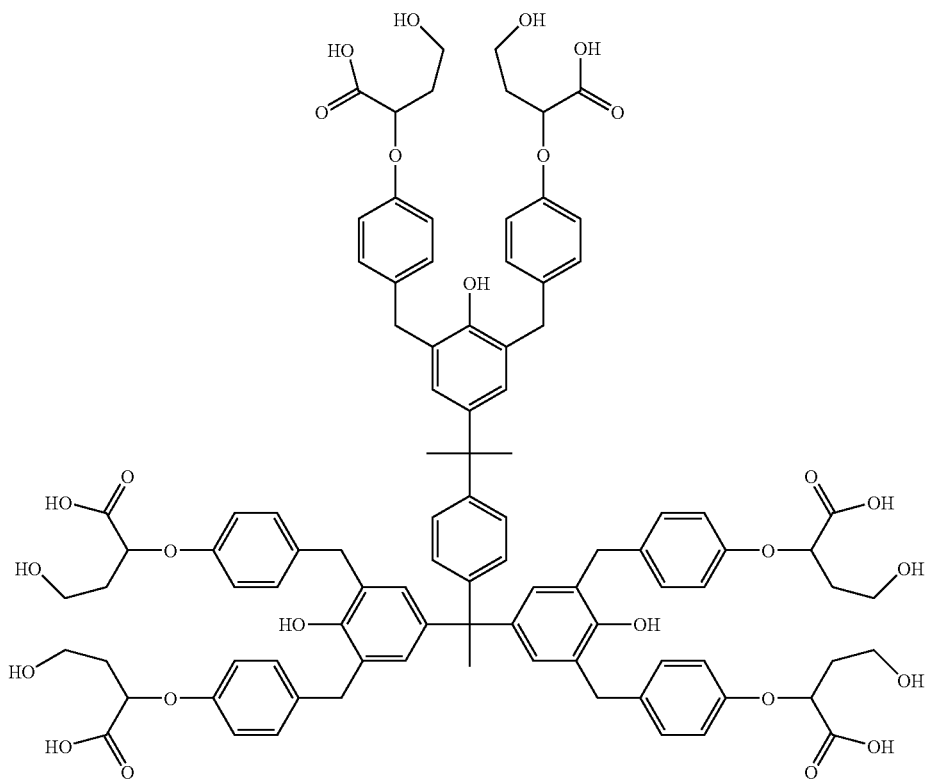

The compound (IX) 100 parts by weight, triphenylsulfonium nonaflate 10 parts by weight, and 2-benzylpyridine 0.05 part by weight were dissolved into 1-methoxy-2-propanol 1000 parts by weight. This was filtrated using a Teflon filter of diameter 0.20 μm to provide a resist solution. The resist solution was spin-coated on the silicon substrate processed with hexamethyl disilazane, and heated for 90 seconds at 100° C. after coating to form a 0.35 μm-thick resist film.

The resist film was subjected to exposure using an electron beam projection exposure apparatus. After exposure, baking after exposure was carried out for 90 seconds at 120° C. Development of the resist film was carried out for 10 seconds with a tetramethylammonium hydroxide aqueous solution (2.38 weight %) at 23° C., and the resist film was then rinsed with pure water for 15 seconds. As a result, a negative resist pattern which is extremely small in edge roughness was formed.

Further, exposure of the resist film was carried out through an alternating phase-shifting mask using an ArF excimer laser stepper (NA=0.60). Thereafter, baking after exposure and development were carried out under the above-described conditions. As a result, a negative 0.10 μm line and space pattern which is extremely small in edge roughness was obtained with the exposure amount 15 mJ/cm². The resist coated on the NaCl plate was irradiated with 15 mJ/cm² of ArF excimer light, and infrared absorption spectrum after baking before and after exposures was measured by FT-1720X made by PerkinElmer Ltd. As a result, it was found that a peak of 3300 cm$^{-1}$ caused by carbonic acid and a hydroxyl group complexly disappeared after baking after exposure. Further, it was found that a peak of 1705 cm$^{-1}$ caused by carbonic acid disappeared, and a peak of 1770 cm$^{-1}$ caused by lactone appeared. It was found that from the change of these absorption peaks, all the six γ-hydroxy carbonic acid per molecule which were present before exposure have been formed into lactone after exposure.

While here, 2-bromo-γ-butyrolactone was used as a lactone compound reacted with multi-nuclear phenol, it is noted that 2-bromo-3-dimethyl-γ-butyrolactone, and 2-bromo-d-valerolactone can be used.

The number of reactive groups per molecule of the compound (X) is 6, and the molecular weight is 1600. The number of lactone reactions per molecule necessary for resolution increases as a developer concentration becomes rich. In the present embodiment, the developer concentration was set to a concentration such that insolubility state occurs when 5 reactive groups were formed into lactone.

Embodiment 7

As another embodiment of the present invention, an example will be described in which a negative resist using a steroid frame as nuclear is synthesized.

Citric acid 50.0 g (260 mmol) and 1,3-diiode-propane 38.5 g (130 mm) were dissolved into tetrahydrofrane 500 ml, and sodium hydroxide 9.4 g (390 mmol) was gradually added thereto. After stirring for 12 hours at room temperature, sodium iodide being precipitated was filtered. Ethyl acetate 500 ml was added to filtrate, and washed with dilute hydrochloric acid 500 ml. After washing, an organic phase was dried with sodium sulfate anhydride, after which the solvent was reduced in pressure and removed, and the residue was poured into an n-hexan/tetra hydrofrane mixing solution 300 ml. Precipitated material was filtrated to obtain a compound (X).

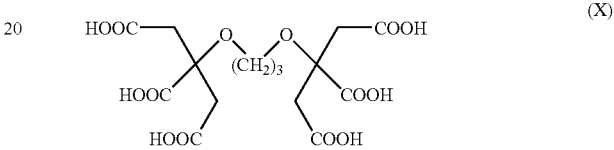

(X)

The obtained comopound (X) 10.0 g (23.6 mmol) was mixed with thionyl chloride 84.1 g (707 mmol) and one drop of dimethyl formamide, and refluxed for 4 hours till generation of gas stops under stirring. After refluxing, non-reacted thionyl chloride was reduced in pressure and removed to obtain an acid chloride (XI).

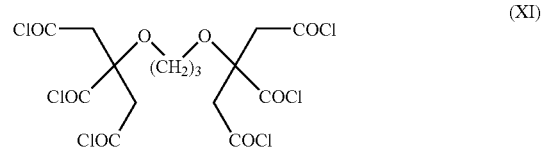

(XI)

Next, trans-androsterone 10.0 g (34.4 mmol), and pyridine 4.09 g (51.6 mmol) were dissolved into tetrahydrofurane 200 ml, and a solution having acid chloride (XI) 3.07 g (5.74 mmol) dissolved into tetra hydrofurane 30 ml was dropped therein at 0° C. After dropping, stirring of the thus-obtained solution was done for two hours at room temperature, and further the solution stirred was heated and refluxed for six hours. After refluxing, hydrochloride of pyridine being precipitated was filtered. Ethyl acetate 300 ml was added to the filtrate, and washed with water of 200 ml three times. After washing, an organic phase was dried with sodium sulfate anhydride, after which the solvent was reduced in pressure and removed, and the residue was poured into a hexan/tetrahydrofurane mixing solution 500 ml. The precipitated material was filtered to obtain a compound (XII).

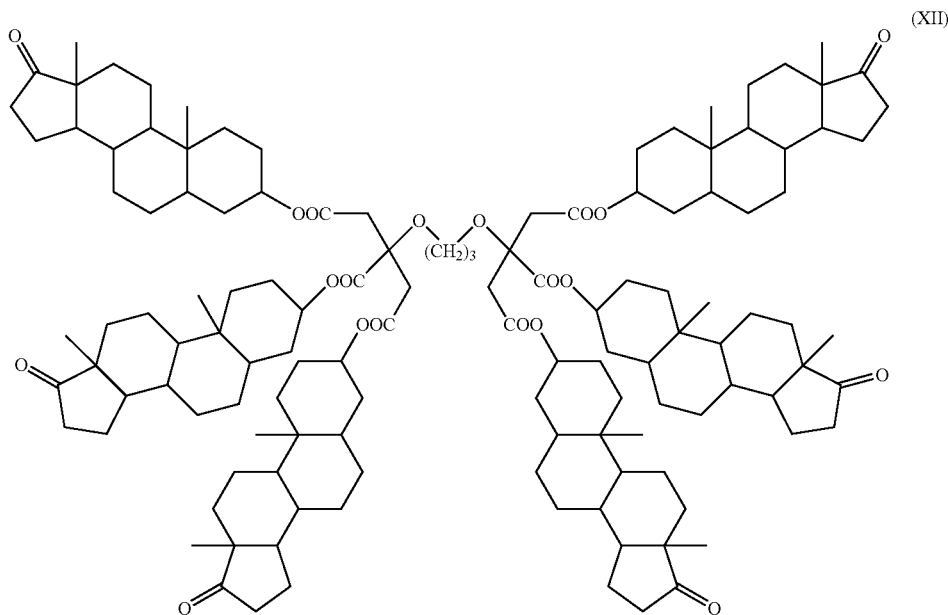

The obtained compound (XII) 5.0 g (2.43 mmol) was dissolved into acetic acid 150 ml, and hydrogen peroxide water 50 ml and p-toluene sulfonic acid 0.5 g were added thereto and stirred for 12 hours at 50° C. After reaction, the solvent was reduced in pressure and removed and the residue was poured into water of 1 liter. The precipitated material was filtered and dried to obtain a compound (XIII) having a d-lactone moiety.

The compound (XIII) 3.0 g (1.39 mmol) synthesized as described above was dissolved into tetrahydrofurane 100 ml, a 0.13 N tetramethylammonium aqueous solution 65 ml was added thereto and stirred for 6 hours. A hydrochloric acid aqueous solution was gradually added to be weakly acidic. Ethyl acetate 200 ml was added to the solution, extraction was carried out two times, and the obtained organic phase was washed two times with water 200 ml. After washing, the

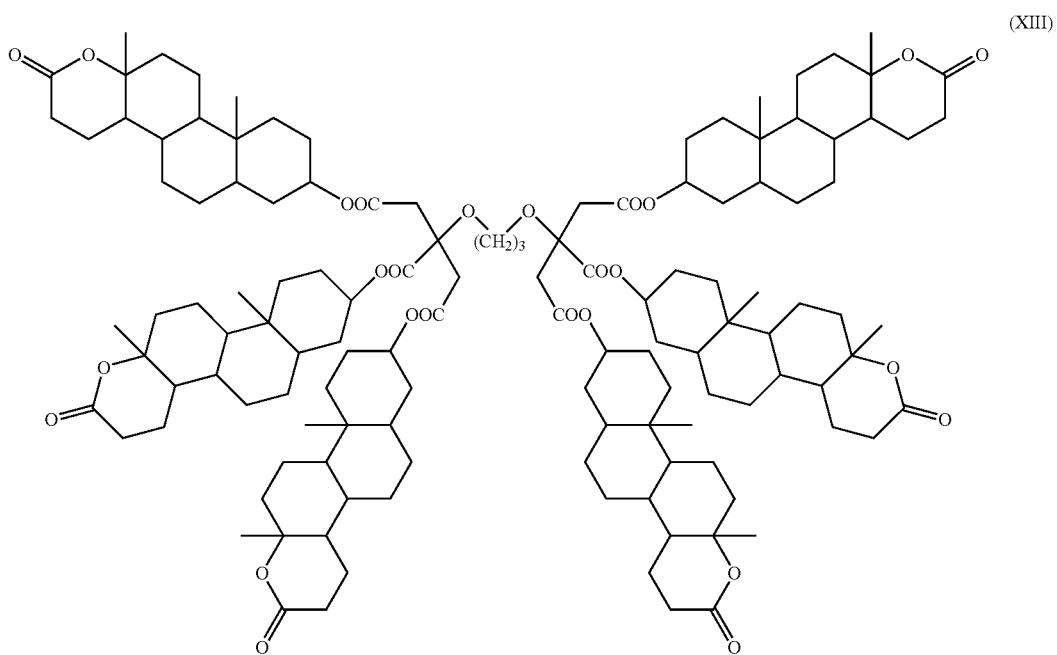

organic phase was dried with sodium sulfate anhydride, after which the solvent was reduced in pressure and removed, and the residue was poured into n-hexan 300 ml. The precipitated material was filtered and dried to obtain a compound (XIV) having 6 d-hydroxy carbonic acid moieties.

from the change of these absorption peaks, all the six d-hydroxy carbonic acids per molecule which were present before exposure have been formed into lactone after exposure.

It is noted that an example of a negative resist using a steroid frame has been already present, but since the main

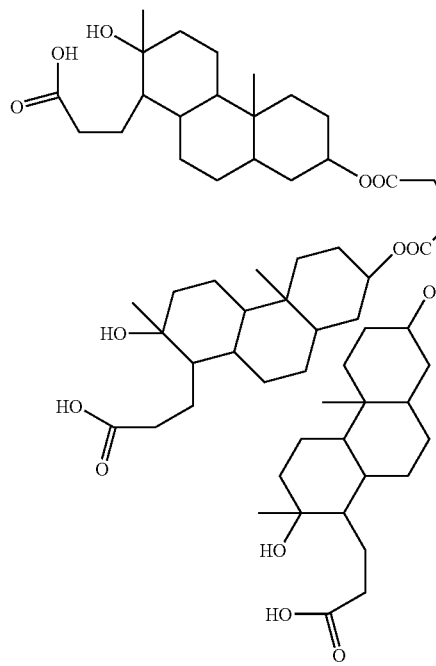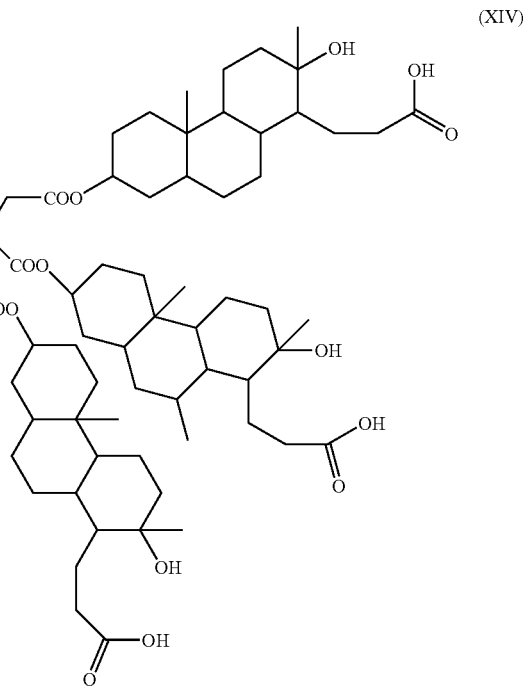

(XIV)

The compound (XIV) 100 parts by weight, triphenylsulfonium nonafrate 10 parts by weight, and 2-benzylpyridine 0.05 part by weight were dissolved into 1-methoxy-2-propanol 1000 parts by weight. This was filtered using a Teflon filter of diameter 0.20 μm to provide a rsist solution. The resist solution was spin-coated on the silicon substrate processed with hexamethyldisilazane, and heated for 90 seconds at 100° C. after coating to form a 0.35 μm-thick resist film.

Exposure of the resist film was carried out using an electron beam projection exposure apparatus. After exposure, baking after exposure was carried out for 90 seconds at 120° C. Development of the resist film was carried out for 10 seconds with tetramethylammonium hydroxyl aqueous solution (2.38 weight %) at 23° C. and the resist film was then rinsed with pure water for 15 seconds. As a result, a resist pattern which is extremely small in edge roughness was formed.

Further, exposure of the resist film was carried out through an alternating phase-shifting mask using an ArF excimer laser stepper (NA=0.60). Thereafter, baking after exposure under the above-described process conditions and development were carried out. As a result, a negative 0.10 μm line and space pattern which is extremely small in edge roughness was obtained with an exposure of 10 mJ/cm$^2$.

The resist coated on the NaCl plate was irradiated with 10 mJ/cm$^2$ of ArF excimer light, and infrared absorption spectrum after baking before and after exposures was measured. As a result, it was found that a peak of 3300 cm$^{-1}$ caused by carbonic acid and a hydroxyl group completely disappeared after baking after exposure. Further, it was found that a peak of 1700 cm$^{-1}$ caused by carbonic acid disappeared, and a peak of 1740 cm$^{-1}$ caused by lactone appeared. It was found that component constituting a resist is a conventional polymer, the edge roughness is similar to the conventional resist. On the contrary, in the present embodiment, the roughness was reduced.

The number of reactive groups per molecule of the compound (XIV) is 6, and the molecular weight is 2275. The number of lactaone forming reaction per molecule necessary for resolution increases as the developer concentration becomes rich. In the present embodiment, a developer concentration was set to a concentration such that when 6 reactive groups are formed into lactone, insolubility state occurs.

Embodiment 8

As another embodiment of the present invention, an example will be described in which a positive resist using a steroid frame as nuclear is synthesized.

Cholic acid tert-butyl ester 10.0 g (21.5 mmol) and pyridine 2.55 g (32.3 mmol) were dissolved into tetrahydrofrane 200 ml, and a solution having acid chloride (XI) 1.92 g (3.59 mmol) dissolved into tetrahydrofurane 30 ml was dropped thereon at 0° C. After dropping, stirring was done for 2 hours at room temperature, and further the solution stirred was heated and refluxed for 6 hours. After refluxing, hydrochloride of pyridine being precipitated was filtered. Ethyl acetate 300 ml was added to the filtrate, and washed three times with water 200 ml. After washing, an organic phase was dried with sodium sulfate anhydride, after which the solvent was reduced in pressure and removed, and the residue was poured into a hexan/tetrahydrofurane mixing solution 500 ml. The precipitated material was filtered to obtain a compound (XV).

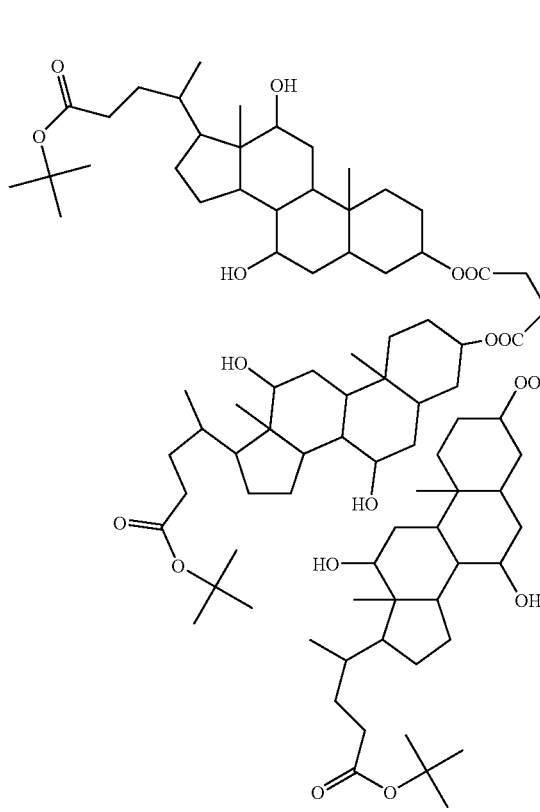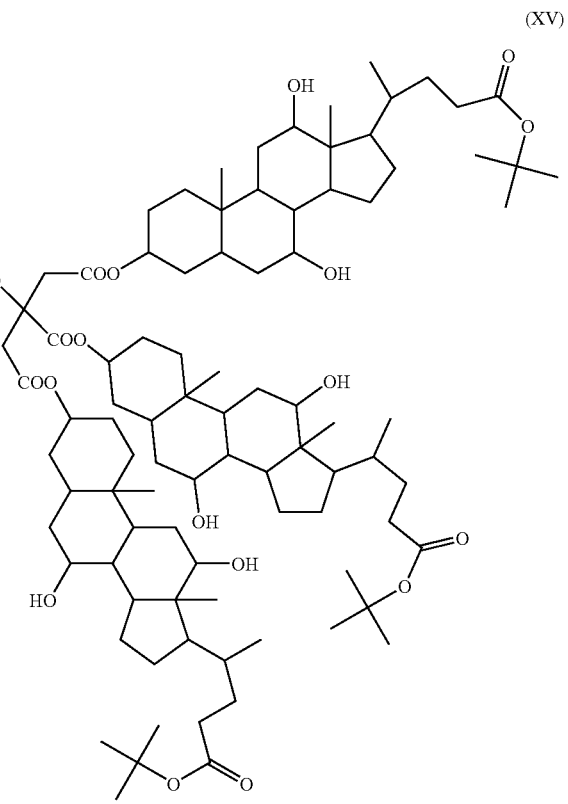

(XV)

The compound (XV) 100 parts by weight, triphenylsulfonium nonaflate 10 parts by weight as an acid generator, and 2-benzylpyridine 0.05 part by weight were dissolved into propylene glycol methyl acetate 1000 parts by weight. This was filtered using a Teflon filter of diameter 0.20 μm to provide a resist solution. The resist solution was spin-coated on the silicon substrate processed with hexamethyldisilazane, and heated for 90 seconds at 100° C. after coating to form a 0.35 μm-thick resist film.

Exposure of the resist film was carried out using an electron beam projection exposure apparatus. Baking after exposure was carried out for 90 seconds at 120° C. after exposure. Development of the resist film was carried out for 10 seconds with a tetramethylammonium hydroxide aqueous solution (0.05 weight %), and the resist film was then rinsed with pure water for 15 seconds. As a result, a resist pattern which is extremely small in edge roughness was formed.

Further, the resist film was subjected to exposure through an alternating phase-shifting mask using an ArF excimer laser stepper (NA=0.60). Thereafter, baking after exposure and development under the above-described process conditions were carried out. As a result, a negative 0.10 μm line and space pattern which is extremely small in edge roughness was obtained with an exposure of 20 mJ/cm².

The number of protection groups per molecule of the compound (XV) is 6, and the molecular weight thereof is 3100. The de-protection reaction number per molecule necessary for resolution increases as a developer concentration becomes lean. Here, a developer concentration was set to a concentration such that when six pieces are de-protected, dissolution occurs.

The resist coated on the NaCl plate was irradiated with 20 J/cm² of ArF excimer light, and an infrared absorption spectrum after baking before and after exposures was measured. As a result, it was found that a peak of 3300 cm$^{-1}$ caused by carbonic acid appeared after baking after exposure. Further, it was found that a peak of 1705 cm$^{-1}$ caused by carbonic acid appeared, and a peak of 1720 cm$^{-1}$ caused by tert-butyl ester group completely disappeared. It was found that from the change of these absorption peaks, all the six tert-butyl ester groups are de-protected after exposure.

While here, as a steroid compound having tert-butyl ester, cholic acid tert-butyl ester was used, it is noted that deoxycholic acid tert-butyl ester, lithocholic acid tert-butyl ester, ursodeocholic acid tert-butyl ester and the like can be used.

Further, an example of the positive resist using a steroid frame has been already known. However, since the main component of a matrix constituting a resist is a conventional polymer, the edge roughness is similar to the conventional resist. On the contrary, in the present embodiment, the roughness was reduced.

Embodiment 9

The positive resist solution mentioned in Embodiment 1 was spin-coated on the silicon substrate processed with hexamethyl disilazane, and heated for two minutes at 100° C. after coating to form a 150 nm-thick resist film. Various patterns were projected and exposed on the resist film using an electron beam projection exposure apparatus of acceleration voltage 100 kV, and further baking after exposure was carried out thereto for 3 minutes at 120° C. Thereafter, the wafer was developed using a super critical development apparatus as described later to obtain a negative pattern.

First, the wafer is installed on a super-critical carbon dioxide chamber, after which a liquid carbon dioxide ($CO^2$) is introduced into the chamber. The chamber is filled with liquefied carbon dioxide, and thereafter, pressure is elevated to critical pressure (7.38 Mpa) or more, and then a temperature is elevated to a critical temperature (31.1° C.) or more to place the interior of the chamber in a super-critical state of carbon dioxide. After this state has been maintained for a fixed period of time, pressure is lowered to make the interior of the chamber a gaseous phase. Thereafter, the wafer was taken out outside from the chamber. In the super-critical state of carbon dioxide, The non-exposure section of the resist is dissolved into super-critical carbon dioxide because of non-polarity, and on the other hand, and a portion polarized by the de-protection caused by exposure is not dissolved but remains to form a pattern. Since the surface tension in the super-critical state is approximately 0, the surface tension acting on the resist pattern during the process of transfer from super-critical to gaseous phase (drying of a wafer) is very small, and accordingly, deformation or falling of the resist pattern was suppressed.

According to the present embodiment, a line and space pattern of 40 nm could be formed without occurrence of falling of a resist pattern. The fact that the line edge roughness of the obtained pattern is small as compared with the conventional resist with a polymer as a base is similar to other embodiments.

The super-critical development of the present embodiment can be also applied to other resist materials shown in other embodiments of the present invention. For example, this procedure is carried out for the negative resist shown in Embodiment 1 whereby a positive pattern which is small in line edge roughness can be formed without producing resist pattern falling.

Embodiment 10

The negative resist solution mentioned in Embodiment 2 was spin-coated on the silicon substrate processed with hexamethyl disilazane, and heated for two minutes at 100° C. after coating to form a 150 nm-thick resist film. Various patterns were projected and exposed on the resist film using a EUV reduction projection exposure apparatus, and subjected to fixed heat treatment and development to form a resist pattern which is extremely small in edge roughness. Thereafter, DUV curing was carried out for the resist pattern. The base film was processed by dry etching with the resist pattern as a mask, and the resist pattern was transferred to the base film. The resist pattern holds a relatively good (square) shape even during etching irrespective of rise of substrate temperature at the time of dry etching to obtain a base pattern which is extremely small in edge roughness and has a good shape. While here, a DUV curing device for resist corresponding to KrF exposure was utilized, but the apparatus is not limited thereto. Further, the EB curing was carried out to obtain similar effect. An EB curing device for ArF resist was utilized, but the apparatus is not limited thereto. On the other hand, where dry etching was carried out without subjecting to the above-described curing, the resist is thermally deformed due to elevation of the base temperature during dry etching, thus posing a problem that a dimension shift in transfer of a pattern to the base increases.

The curing process of the present embodiment can be also applied to other resist materials shown in the present invention.

Embodiment 11

Figure 1:
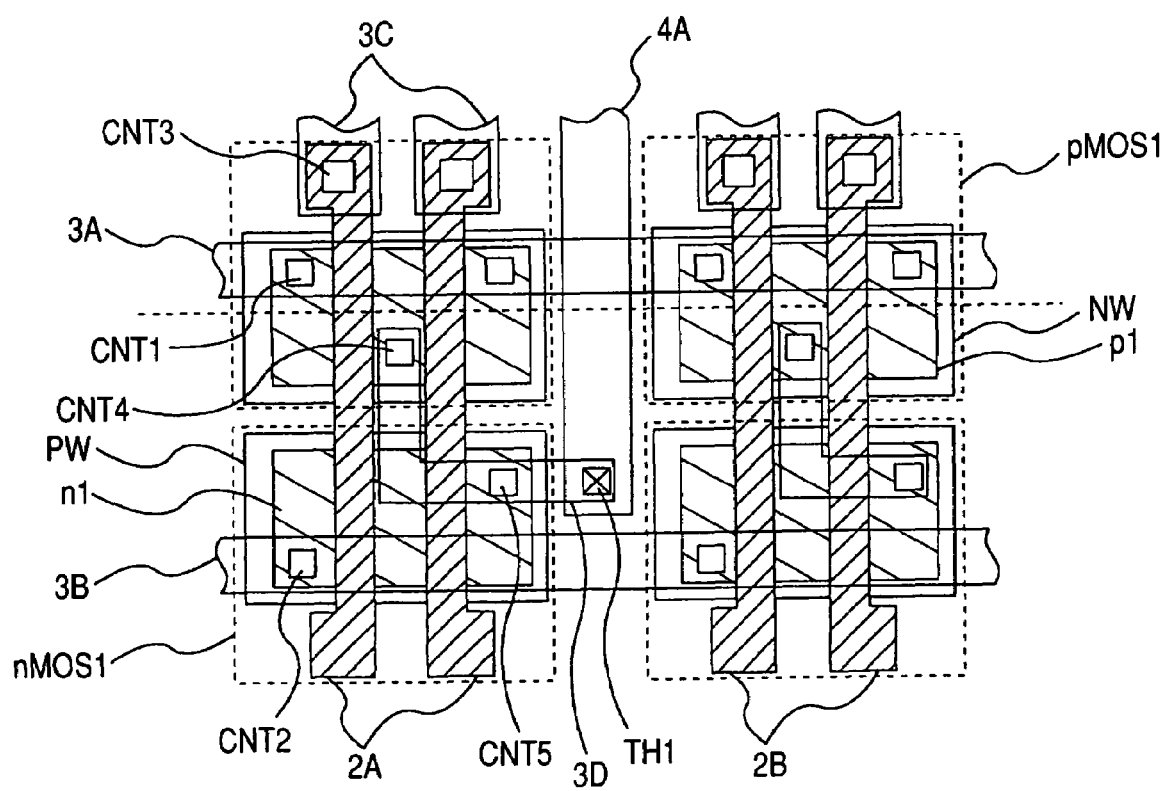
FIG. 1 is a schematic view showing the plane structure of a device according to one embodiment of the present invention.

In the present embodiment, a method for preparing a semiconductor device using the materials of Embodiment 1 will be described with reference to FIGS. 1 to 4. FIG. 1 is a plan view showing of part (2 input NAND gate circuit) of a logic gate in a typical logic LSI (a semiconductor integrated circuit device). Two n type MOS transistor elements nMOS1 and two p-type MOS transistor elements pMOS1 are formed on an n-type semiconductor region n1 on the surface of a p-type well region PW formed on a semiconductor substrate and a p-type semiconductor region p1 on the surface of a n-type well region NW, respectively. Gate electrodes 2A and 2B are common to nMOS1 and pMOS1. The gate electrode 2A is constituted by a polycide construction in which a silicide layer is provided, for example, on the upper part of a single film of low resistance poly-crystal silicon or on the upper part of low resistance poly-crystal silicon film; a poly-metal construction in which a metal film made of tungsten or the like through a barrier film made of nitride tungsten or the like is accumulated on a low resistance poly-crystal silicon film; or a damascene gate electrode construction formed by accumulating a barrier film made of nitride titanium or the like into a groove formed in an insulating film and embedding a metal film made of copper or the like therein. A semiconductor substrate portion at the lower part of a gate insulating film downward of the gate electrode 2A forms a channel region.

Wiring 3A is a power supply wiring, for example, on the high potential (for example, 0.5V to 1.5V or so) side, which is connected electrically to a p-type semiconductor region p1 as shown in FIG. 1 through a contact hole CNT1. Further, Wiring 3B is a power supply wiring, for example, on the low potential (for example, 0V or so) side, which is connected electrically to a n-type semiconductor region n1 as shown in FIG. 1 through a contact hole CNT2. Wiring 3C is an input wiring of the above-described circuit, which comes in contact with the wide portion of a gate electrode 2A through a contact hole CNT3 and is connected electrically. Wiring 3D is connected electrically to both n-type semiconductor region n1 and p-type semiconductor region p1 through contact holes CNT4 and 5. Wiring 4A is connected electrically to a wiring 3D through a through-hole TH1. The wirings 3A to 3D are so-called in-cell wiring, all of which are formed on the first wiring layer. The actual integrated circuit includes various kinds of a number of logic gates including elements similar to those described above, these logic gates being connected each other by wiring of first to fifth wiring layers.

Figure 2:
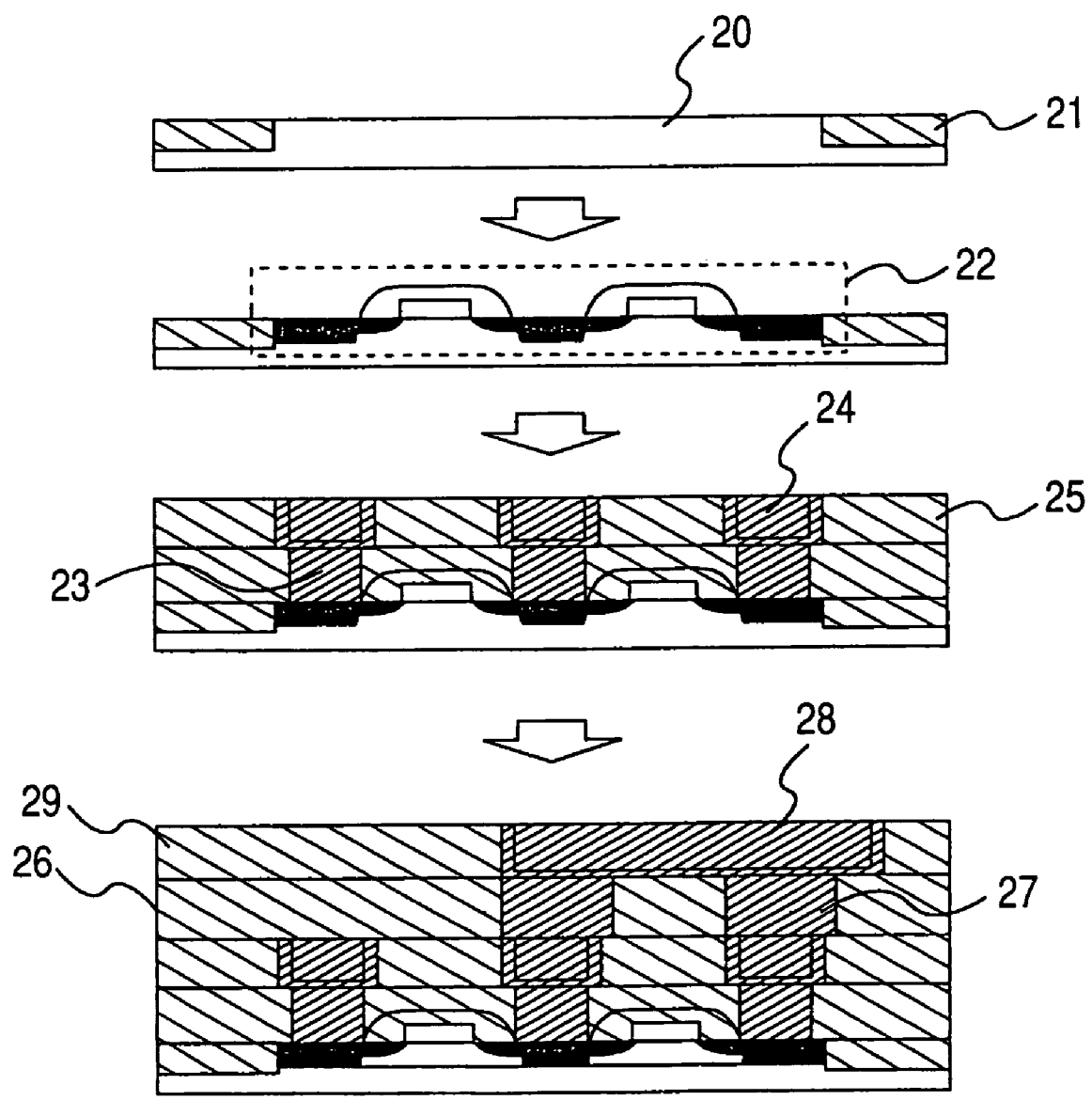
FIG. 2 is a sectional view schematically showing the preparing process of a device according to one embodiment of the present invention.
Figure 3:
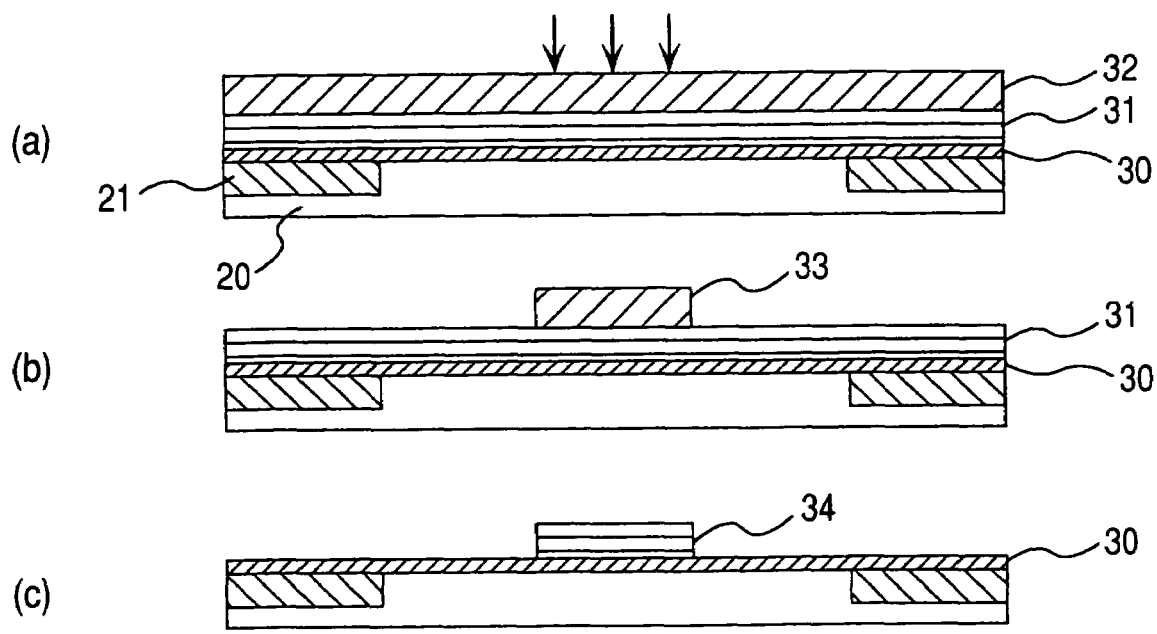
FIG. 3 is a sectional view schematically showing the preparing process of a device according to one embodiment of the present invention.

FIG. 2 is a schematic view showing a manufacturing process of the semiconductor device using a sectional view of a typical part of the device. First, an element isolation region 21 is formed on an Si substrate 20 (FIG. 2, first stage), a MOS transistor 22 is formed (FIG. 2, second stage), a contact hole 23, a first layer wiring 24 and an inter-wiring dielectric film 25 are formed (FIG. 2, third stage), an inter-layer dielectric film 26 and a connection hole 27 are formed, and a second layer wiring 28 and inter-wiring dielectric film 29 (FIG. 2, fourth stage) are formed. Similarly, wirings more than the third layer (not shown) are formed.

In the present embodiment, in forming the above-described patterns of the element isolation region 21, MOS transistor gate, contact hole 23, first layer wiring 24, connection hole 27, and second layer wiring 28, radio sensitive materials according to the present invention depending on the exposure method used for forming patterns were utilized. Some of steps out of them will be described in further detail.

First, forming a gate pattern for which particularly higher accuracy is required will be described further. The area rate of a gate pattern occupied by all chips is small. A gate dielectric film 30, and a gate laminating film 31 (including a hard mask film) are laminated and formed on the main surface of a device formed with the element isolation region 21, after which the negative resist material described in Embodiment 1 is coated, and a fixed heat treatment step is carried out to form a resist film 32 (FIG. 3 (*a*)). Then, using an ultraviolet (EUV) projection exposure apparatus and a reflection type mask for ultraviolet (EUV) projection exposure formed with a desired gate and a wiring pattern for connecting between the gates, a pattern on the mask was projected and exposed on the resist film 32. Thereafter, fixed heat treatment step is carried out. And regions other than ultraviolet (EUV) exposure portion are removed by the development treatment using an alkali developer to form a resist pattern 33 (FIG. 3 (*b*)). The resist pattern 33 was formed in plane so that the desired pattern may be covered. Thereafter, using the resist pattern 33 as an etching mask, a gate stack layer 31 exposed therefrom is subjected to etching to form a gate pattern 34, after which the resist pattern 33 was removed to form the desired gate and the layer wiring pattern for connecting between the gates (FIG. 3 (*c*)).

In the present embodiment, it is possible to form a gate pattern which is small in roughness with high accuracy by making use of the material described in the embodiment, and therefore, a semiconductor device of high performance without element performance deterioration caused by a local short channel effect due to the roughness could be manufactured. Further, in the present embodiment, since the negative resist is used, a reflection type mask with a gate pattern portion as a reflection surface results, but the area rate of a gate pattern occupied by all chips is small so that the proportion of the reflection surface occupied by the mask is small (so-called dark field type), thus reducing probability of having a phase defect of the reflection surface, and improving a mask manufacturing yield and a chip manufacturing yield.

Figure 4:
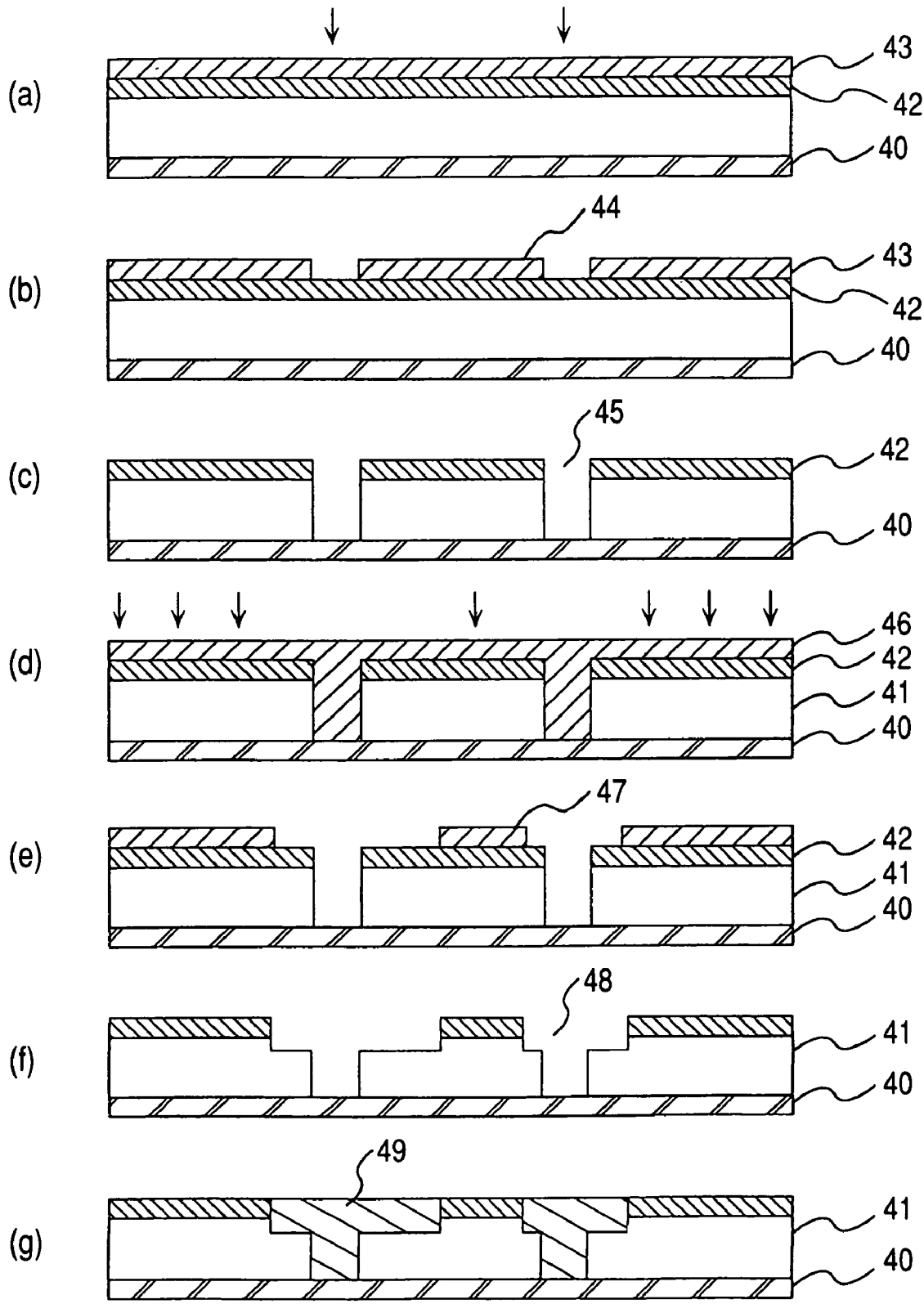
FIG. 4 is a sectional view schematically showing the preparing process of a device according to one embodiment of the present invention.

Next, as one example applied to the latter half portion of the manufacturing steps, a method of forming a copper wiring according to dual damascene method according to the present invention will be described. First, a low dielectric constant inter-layer dielectric film 41 and a capping layer 42 are stacked on a wiring substrate 40 whose surface is smoothed as shown in FIG. 4 (*a*), the positive resist material described in Embodiment 2 is coated, and the fixed heat treatment step was carried out to form a resist film 43 (FIG. 4 (*a*)). Then, using a reflection type mask for ultraviolet (EUV) projection exposure having the desired connection hole pattern as a reflection pattern, projection exposure was done on the resist film 43 by using an ultraviolet (EUV) projection exposure apparatus. Thereafter, the fixed heat treatment step is carried out, and the ultraviolet (EUV) exposure region was removed by development process using an alkali developer to form a resist pattern 44 having an opening at the desired connection hole position (FIG. 4 (*b*)). Thereafter, using the resist pattern 44 as an etching mask, a capping film and a low dielectric inter-layer film exposed therefrom were subjected to etching to remove the resist pattern 44 (FIG. 4 (*c*)) to form a connection hole 45. Next, after coating the negative resist material described in Embodiment 1, the fixed heat treatment step was carried out to form a resist film 46 (FIG. 4 (*d*)). Then, the reflection type mask for ultraviolet (EUV) projection exposure having regions other than a desired wiring trench pattern as reflection patterns was projected and exposed on the resist film 46 using an ultraviolet (EUV) projection exposure apparatus. Thereafter, the fixed heat treatment step is carried out, and the regions other than the ultraviolet (EUV) light exposure portion were removed by the development process using an alkali developer to obtain a resist pattern 47 having an opening in the desired wiring trench portion (FIG. 4 (*e*)). Thereafter, using the resist pattern 47 as an etching mask, the capping film and the low dielectric inter-layer film exposed therefrom were subjected to etching, after which the resist pattern 47 was removed (FIG. 4 (*f*)) to form a desired wiring trench 48. Thereafter, copper is buried into the wiring hole or trench, and CMP was carried out to form a copper wiring 49 as shown in FIG. 4 (*g*). With this method, a wiring with high electric reliance without problems such as uneven electric resistance or breakage could be formed with high dimensional accuracy. In particular, after forming a wiring hole, in forming a resist pattern for processing a trench pattern on low dielectric inter-layer film, defective resist resolution caused by so-called poisoning that has been notable in the conventional positive resist could be suppressed. Thus, it was possible to prepare, with high accuracy, high yield and high throughput, a semiconductor integrated circuit having a fine pitch wiring that has been difficult in the conventional exposure method.

While in the present embodiment, the ultraviolet (EUV) projection exposure method was used as the main exposure method, it is noted that a method is not limited thereto but various methods can be used. For example, an electron beam projection exposure method, an ArF excimer laser exposure method and the like may be used. In that case, the radio sensitive materials are preferably changed suitably within the scope not departing from the essence of the present invention. Further, the foregoing relates to a manufacturing method of a semiconductor device, but the matter is not particularly limited thereto. For example, the present invention can be applied to a liquid crystal display, a magnetic head, a material (disk) for optical disk, a material disk for magnetic disk (patterned media), an optical integrated circuit, various MEMS (Micro-electro mechanical systems), and the like by using similar methods if they carry out a pattern transfer on the sensitive substrate by emitting an energy beam.

Embodiment 12

Figure 5:
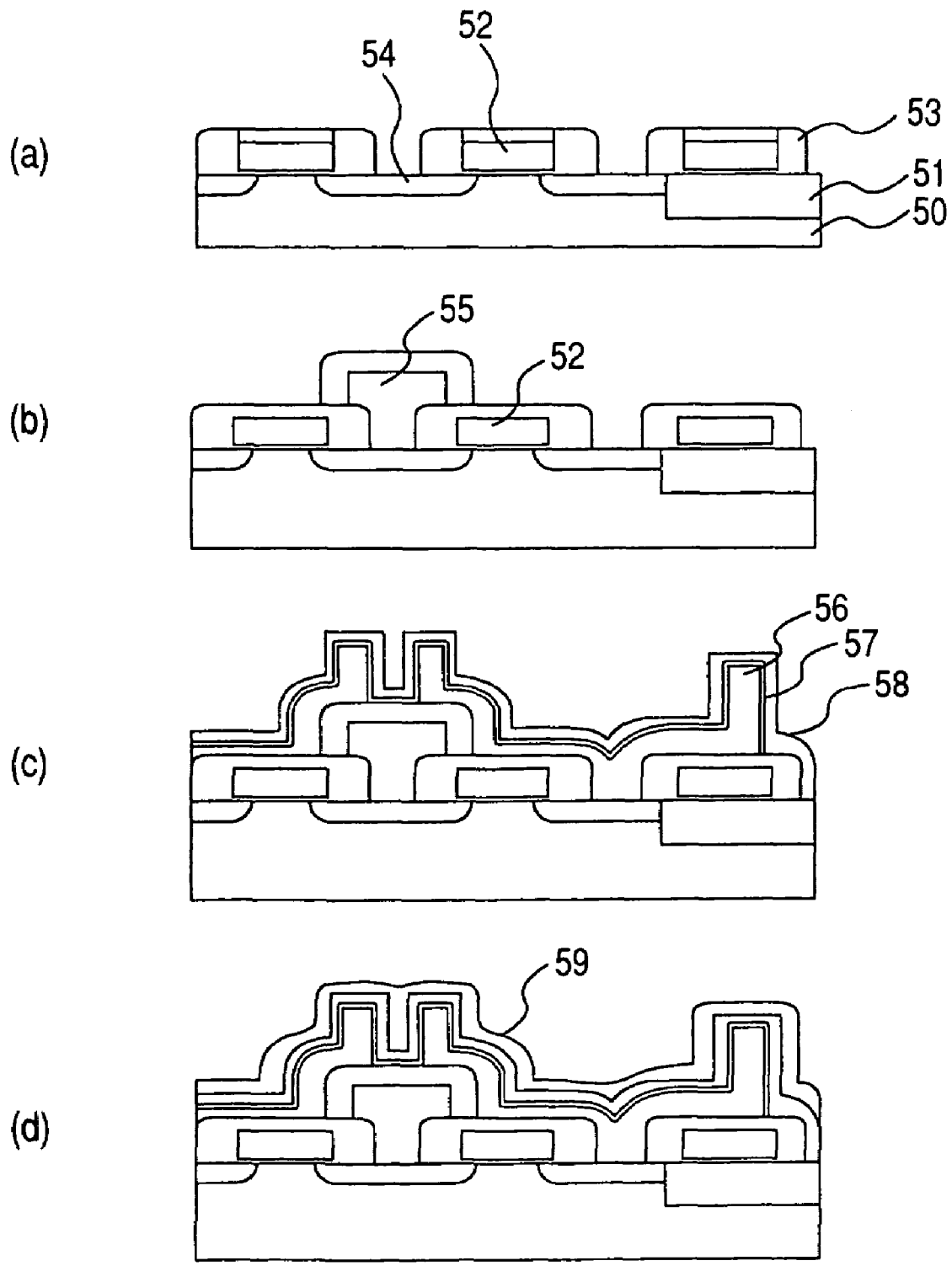
FIG. 5 is a sectional view schematically showing the preparing process of a device according to another embodiment of the present invention.
Figure 6:
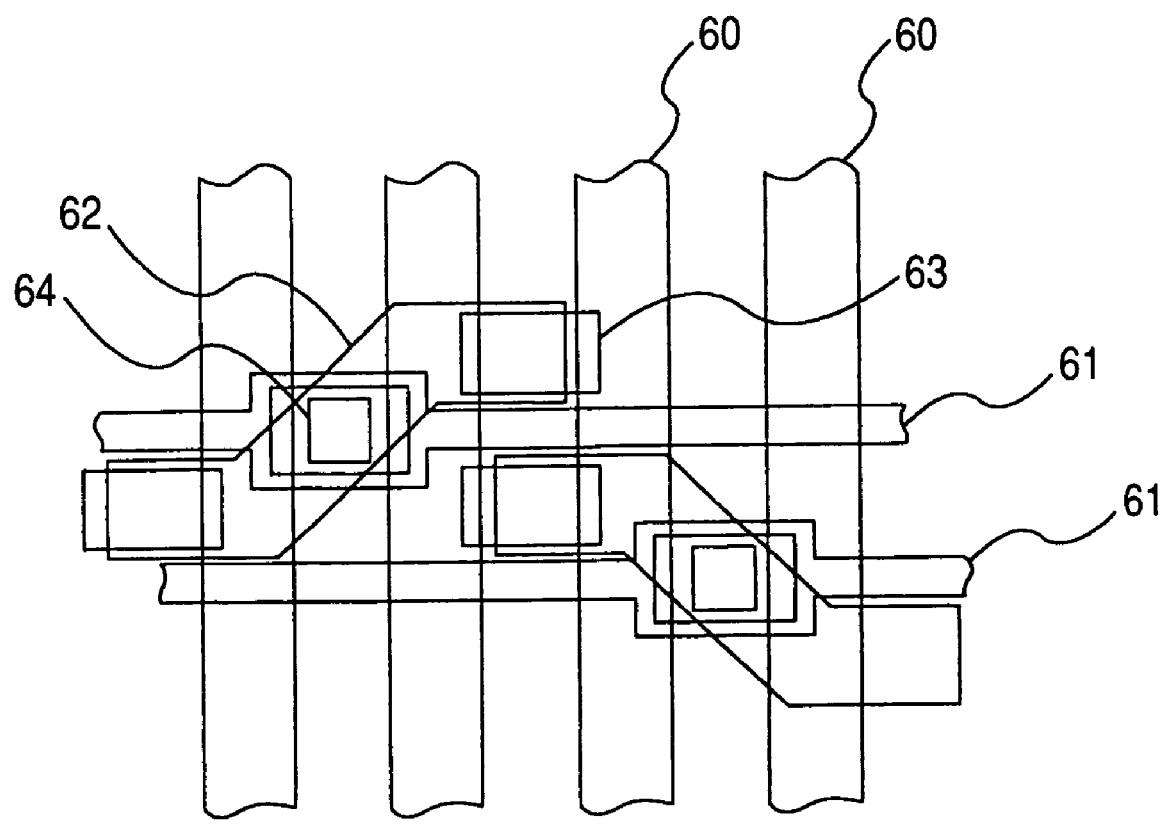
FIG. 6 is a sectional view schematically showing the preparing process of a device according to another embodiment of the present invention.

In the present embodiment, a method of preparing a semiconductor memory element using the material of Embodiment 2 will be described with reference to FIGS. 5 and 6. FIG. 5 is a sectional view showing main steps of manufacturing elements. As shown in FIG. 5 (*a*), a p-type Si semiconductor 50 is used as a substrate, and an element isolation region 51 is formed on the surface thereof using a known element isolation technique. Next, there is formed a word line 52 of the construction, for example, in which 150 nm-thick multi-crystal Si and 200 nm-thick $SiO_2$ were stacked. 150 nm-thick $SiO_2$ is deposited using a chemical vapor deposition, and a side spacer 53 of $SiO_2$ is formed on the side wall of the word line by anisotropy working. Next, a diffusion layer 54 is formed by a conventional method. Next, as shown in FIG. 5 (*b*), a data line 55 formed from multi-crystal Si or a high melting point metallic silicide or a laminated film of these is formed via a conventional step. Next, as shown in FIG. 5 (*c*), a storage node electrode 56 formed from multi-crystal Si is formed via a conventional step. Thereafter, $Ta_2O_5$, $Si_3N_4$, $SiO_2$, BST, PZT, viscous dielectric, or a composite film of these are deposited to form an insulating film 57 for capacitor. Then a multi-crystal Si, high melting point metal, high melting point metal silicide or low-resistance conductors such as Al, Cu or the like are deposited to form a plate electrode 58. Next, as shown in FIG. 5 (*d*), a wiring 59 is formed via a conventional step. Next, a memory element is manufactured via a conventional wiring forming step or passivation step. It is noted that only the manufacturing steps have been described, but conventional manufacturing steps were used for others.

In the present embodiment, pattern formation of various element constructions described above were carried out using the resist according to the present invention and ArF excimer laser exposure. In particular, for formation of various patterns of element isolation region, word line, and data line, a combination of alternating type phase shifting mask and negative resist was used, while for formation of storage electrode pattern, a combination of alternating type phase shifting mask and positive resist was used. It is noted that for example, in a conducive hole forming step in the passivation process, and in the step in which a pattern dimension is relatively large like pattern formation in an ion implantation mask forming step, the resist material according to the present invention was not used.

Next, a pattern formed by lithography will be described. FIG. 6 shows a pattern arrangement of a memory portion of a typical pattern constituting a memory device manufactured. Reference numeral 60 denotes a word line, 61 a data line, 62 an active region, 63 a storage electrode, and 64 a pattern of an electrode taking out hole. Also in this example, the pattern formation of the embodiment according to the present invention was used for the whole parts except the formation of electrode taking out hole 64. In the step using the minimum design rule even except the pattern formation shown here, the present invention was used.

In the device prepared using the present invention, the dimension between patterns is small as compared with the device prepared using the conventional method. Therefore, the devices of the same construction can be made small, and the number capable of manufacturing from a single wafer when the semiconductor element is manufactured increases, and the yield is improved.

INDUSTRIAL APPLICABILITY

According to the present invention, in manufacturing a semiconductor device by forming a pattern by irradiating resist film with a patterned radiation, the resist is constituted using, as main components, derivative molecules (desirably, average diameter is smaller than 2 nm) such as cyclodextrine having the defined molecular weight of 5000 or less including an acid generation group which produces an acid catalyst by irradiation of radiation and the defined number of reactive groups of 4 or more which produces polarity conversion reaction by the acid catalyst, calixarane, multi-nuclear phenol, dendrimer, fullerene, crown ether, androsteron derivative, silicon (Si) monomer origomer and the like. With this, the acid catalyst reaction number required for one molecule to acquire solubility is 4 or more, or an average distance (reciprocal of the cube root of a reactive group concentration) between the reactive groups is 1% or less of the minimum dimension of the pattern. Further, an acid generator molecule including the acid generation group is made clathrate to the molecule, or the acid generation group is combined with the molecule, whereby an average distance (reciprocal of the cube root of acid concentration) between acid catalyst molecules generated in the exposure portion is 5% or less of dimension of the minimum pattern to be transferred, and a diffusion length of acid generated is 15% or less of the minimum pattern dimension. Thus, a semiconductor device or a semiconductor integrated circuit of high performance and high integration can be manufactured at low cost using a pattern forming method which is high in resolution and small in edge roughness.

Further, positive reaction using de-protection reaction of a hydroxyl group protected by a protection group, or negative reaction using carbinol molecule dewatering reaction such as lactone reaction, pinacol transition or the like are used properly. Thus a dark field mask can be always provided for various layers of a semiconductor integrated circuit using an electron beam projection exposure method or an ultraviolet (EUV) projection exposure method, and a gate, wiring, or hole of a semiconductor integrated circuit can be processed with high accuracy while suppressing influence of a defective mask, increase of flare light, deterioration of resolution, etc.

The invention claimed is:

1. An electronic device manufacturing method, comprising the steps of:
    preparing a substrate;
    forming, on said substrate, a photosensitive organic film having molecules not polymers as a main component for embracing or connecting at least part of acid generation molecules including an acid generation group, including four or more reaction sites which are polarity change reaction groups for controlling solubility with respect to a developer; and
    transferring a hole pattern or a gate pattern to said photosensitive organic film, wherein a plurality of said polarity change reaction groups are provided on the periphery of said molecules not polymers and further changed from alkali solubility to alkali non-solubility by acid generated from said acid generation molecules; and
    wherein said molecules not polymers include, as main constituting elements, at least one of cyclodextrine, calixarane, dendrimer, fullerene, crown ether, androsteron, and silicon monomer-oligomer, or one of the induction elements thereof.

2. The electronic device manufacturing method according to claim 1, wherein said reaction changing from alkali solubility to alkali non-solubility is a reaction by lactone.

3. The electronic device manufacturing method according to claim 1, wherein said transferring is carried out using an energy beam having a wavelength of 193 nm or less.

4. The electronic device manufacturing method according to claim 1, wherein said photosensitive organic film is heat treated while ultraviolet light or an electron beam is emitted after said pattern has been transferred.

5. The electronic device manufacturing method according to claim 1, wherein said photosensitive organic film is developed using a super critical fluid after said pattern has been transferred.

6. An electronic device manufacturing method, comprising the steps of:
    preparing a substrate;
    forming, on said substrate, a photosensitive organic film having molecules not polymers as a main component for embracing or connecting at least part of acid generation molecules including an acid generation group, including four or more reaction sites which are polarity change reaction groups for controlling solubility with respect to a developer; and
    transferring a hole pattern or a gate pattern to said photosensitive organic film, wherein a plurality of said polarity change reaction groups are provided on the periphery of said molecules not polymers and further changed from alkali non-solubility to alkali solubility by acid generated from said acid generation molecules, and wherein said molecules not polymers include cyclodextrine moiety, fullerene moiety, and polyhedral oligomeric silsesquioxane moiety.

7. An electronic device manufacturing method, comprising the steps of:
   preparing a substrate;
   forming, on said substrate, a photosensitive organic film which includes an acid generation group for generating acid by exposure, molecules not polymers whose molecular weight is 5000 or less being a main component, and which carries out control of solubility with respect to a developer by lactone forming reaction at a plurality of reaction sites provided on the periphery of said mother nuclear molecules or pinacol transition reaction; and
   transferring a predetermined pattern to said photosensitive organic film using an energy beam having a wavelength of 193 nm or less.

8. The electronic device manufacturing method according to claim 7, wherein at least part of an acid generation molecule including said acid generation group is made clathrate or combinatory to said molecules not polymers.

9. An electronic device manufacturing method, comprising the steps of:
   preparing a substrate formed with a dielectric film;
   forming, on said substrate formed with the dielectric film, a photosensitive organic film which subjects at least part of an acid generation molecule including an acid generation group to clathrate or combination, and which has a polarity change reaction group for controlling solubility with respect to a developer, and molecules having a defined molecular weight of 5000 or less;
   transferring a predetermined pattern to said photosensitive organic film; and
   etching said dielectric film with said photosensitive organic films used as a mask to form an opening pattern.

10. An electronic device manufacturing method, comprising the steps of:
   preparing a substrate formed with a metal film a semiconductor film;
   forming, on said substrate formed with a dielectric film, a photosensitive organic film which subjects clathrate or combination at least part of an acid generation molecule including an acid generation group to clathrate or combination, and which has a polarity change reaction group for controlling solubility with respect to a developer, and molecules having a defined molecular weight of 5000 or less being a main component;
   transferring a predetermined pattern to said photosensitive organic film; and
   etching said metal film or semiconductor film with said photosensitive organic films used as a mask to leave an island-like pattern.

11. An electronic device manufacturing method, comprising the steps of:
   preparing a substrate;
   forming, on said substrate, a photosensitive organic film which subjects at least part of an acid generation molecule including an acid generation group to clathrate or combination, being smaller in dimension than the width of a transition region in which probability for acquiring solubility changes from 0.1 to 0.9, and which has, as a main component, molecules having a defined molecular weight and including a reaction site which is a polarity change reaction group for controlling solubility with respect to a developer; and
   transferring a hole pattern or a gate pattern to said photosensitive organic film.

12. An electronic device manufacturing method comprising the step of:
   forming a pattern by using a radio sensitive chemical compound which includes an acid generation group that generates an acid catalyst by irradiation of radiation, and which has, as main components, molecules having a defined molecular weight of 5000 or less including four or more defined reaction groups which generates a polarity conversion reaction by said acid catalyst;
   wherein an average distance (a reciprocal of cube root of reaction group concentration) between said reaction groups is 1% or less of the minimum dimension of the pattern formed on said substrate, and an average distance (a reciprocal of cube root of acid generation group concentration) between acid generation groups which generates said acid catalyst by irradiation of radiation is 3% or less of said minimum dimension.

13. The electronic device manufacturing method according to claim 12,
   wherein said molecule is cyclodextrine, calixarane, multi-nuclear phenol, dendrimer, fullerene, crown ether, androsteron, or induction elements of silicon monomer-oligomer.

14. The electronic device manufacturing method according to claim 12,
   wherein said polarity conversion reaction is a reaction changing a polarity from hydrophilic to hydrophobic by lactone forming reaction caused by an acid catalyst reaction, or a carbinol molecule de-watering reaction such as pinacol transition.

15. The electronic device manufacturing method according to claim 12,
   wherein said polarity conversion reaction is a reaction changing a polarity from hydrophilic to hydrophobic by de-protection reaction of a hydroxyl group protected and displaced by a non-polarity protection group by an acid catalyst reaction.

16. An electronic device manufacturing method in which a pattern is formed on a substrate by carrying out development after a patterned radiation is applied to a radio sensitive chemical compound thin film formed on the substrate,
   wherein said radio sensitive chemical compound is a radio sensitive chemical compound having, as main component, molecules having a defined molecular weight of 5000 or less including a reaction group generating a polarity conversion reaction by an acid catalyst; and
   wherein an average distance (a reciprocal of cube root of acid concentration) between acid catalysts generated by the irradiation of radiation is 5% or less of the minimum dimension, and a diffusion length internally of the radio sensitive chemical compound thin film from the irradiation to development of said acid catalyst is 1% or less of the minimum dimension, or the reaction number necessary for changing solubility of one molecule is 4 or more.

17. The electronic device manufacturing method according to claim 16, wherein said irradiation of radiation is ultraviolet (EUV) beam of wavelength 5 to 15 nm, an electron beam, $F_3$ laser beam or ArF excimer laser beam.

18. The electronic device manufacturing method according to claim 16, wherein said radio sensitive chemical compound is a negative type in which solubility of an irradiation portion lowers, and a gate pattern of a transistor is formed on said substrate by electron beam reduction projection exposure through a dark field mask in which the area rate of said radiation transmission portion is smaller than that of non-transmission portion, or by ultraviolet (EUV) beam reduction projection exposure through a dark field mask in which the area rate of said radiation reflecting portion is smaller than that of a non-reflecting portion.

19. The electronic device manufacturing method according to claim 16, wherein said radio sensitive chemical compound is a positive type in which solubility of an irradiation portion increases, and a trench pattern for wiring is formed on said substrate by electron beam reduction projection exposure through a dark field mask in which the area rate of said radiation transmission portion is smaller than that of non-transmission portion, or by ultraviolet (EUV) beam reduction projection exposure through a dark field mask in which the area rate of said radiation reflecting portion is smaller than that of a non-reflecting portion.

20. The electronic device manufacturing method according to claim 16, further comprising the step of carrying out DUV, EB curing after irradiation of radiation.

21. The electronic device manufacturing method according to claim 16, further comprising the step of carrying super critical phenomenon after irradiation of radiation.

* * * * *

UNITED STATES PATENT AND TRADEMARK OFFICE
CERTIFICATE OF CORRECTION

| | |
|---|---|
| PATENT NO. | : 7,642,145 B2 |
| APPLICATION NO. | : 10/523247 |
| DATED | : January 5, 2010 |
| INVENTOR(S) | : Fukuda et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1146 days.

Signed and Sealed this

Sixteenth Day of November, 2010

David J. Kappos
*Director of the United States Patent and Trademark Office*